United States Patent [19]

Yamanaka et al.

[11] Patent Number: 4,805,147
[45] Date of Patent: Feb. 14, 1989

[54] STACKED STATIC RANDOM ACCESS MEMORY CELL HAVING CAPACITOR

[75] Inventors: Toshiaki Yamanaka, Houya; Yoshio Sakai, Tsukui; Tetsuya Hayashida; Osamu Minato, both of Nishitama; Katsuhiro Shimohigashi, Musashimurayama; Toshiaki Masuhara, Nishitama, all of Japan

[73] Assignee: Hitachi, Ltd., Tokyo, Japan

[21] Appl. No.: 871,994

[22] Filed: Jun. 9, 1986

[30] Foreign Application Priority Data

Jun. 10, 1985 [JP] Japan ................. 60-124241

[51] Int. Cl.⁴ .................. G11C 7/00; G11C 11/40
[52] U.S. Cl. .................. 365/154; 365/182; 357/236
[58] Field of Search ........... 365/154, 156, 182, 190; 357/23.6, 52

[56] References Cited

U.S. PATENT DOCUMENTS

| 4,240,097 | 12/1980 | Raymond, Jr. | 357/23.9 |
| 4,532,609 | 7/1985 | Iizuka | 365/154 |
| 4,543,595 | 9/1985 | Vora | 365/154 X |
| 4,590,508 | 5/1986 | Hirakawa et al. | 365/154 X |
| 4,641,165 | 2/1987 | Iizuka | 357/23.6 |

Primary Examiner—Stuart N. Hecker
Assistant Examiner—Alyssa H. Bowler
Attorney, Agent, or Firm—Antonelli, Terry & Wands

[57] ABSTRACT

A static random access memory cell in which capacitors are electrically connected to storage nodes, so that the memory cell will not suffer from soft error even when it is hit by alpha particles. The memory cell has MOS transistors, capacitors constituted by two polycrystalline silicon layers, and resistors constituted by a polycrystalline silicon layer, that are formed on a semiconductor substrate.

20 Claims, 27 Drawing Sheets

STACKED STATIC RANDOM ACCESS MEMORY CELL HAVING CAPACITOR

BACKGROUND OF THE INVENTION

The present invention relates to a semiconductor device, and particularly to a semiconductor device having a high resistivity load and a capacitor in a static MOS random access memory.

A conventional flip-flop type static memory cell makes use of a high resistivity polycrystalline silicon as a load resistor, as shown in an equivalent circuit of FIG. 1 wherein high resistances $R_1$, $R_2$ and driver metal oxide semiconductor transistors (hereinafter referred to as MOS transistors) $T_1$, $T_2$ are connected to storage nodes $N_1$, $N_2$ to constitute a flip-flop type memory cell. MOS transistors $T_3$, $T_4$ are rendered conductive by a word line 1. Storage nodes $N_1$, $N_2$ are connected to bit lines 2. Therefore, the opposing data are read onto the right and left bit lines 2.

The MOS transistor has, as shown in FIG. 2, an $n^+$-type source or drain region 4, a gate insulator 61, and gate electrode 5, that are formed on a $p^-$-type silicon substrate 3. Symbol Vcc denotes a power supply voltage. Such an example has been disclosed in Japanese Patent Laid-Open No. 72069/1980. With the memory cells of the above prior art, however, the following defects arise when it is attempted to reduce the cell areas in order to realize a memory having a high packaging density and a high degree of integration.

(1) High resistances $R_1$, $R_2$ in the equivalent circuit of FIG. 1 make use, as shown in a section view of FIG. 2, of a high resistivity polycrystalline silicon film 11 formed on an insulator 6 on a silicon substrate 3. Since both ends of the polycrystalline silicon film 11 are used as inter-connections, low value resistors 9, 91 are formed in the polycrystalline silicon due to the diffusion of impurities at a high concentration. With such a high-resistance structure, however, reduction in the length l of a high value resistor 11 induces a punch-through phenomenon. Therefore, a heavy current flows across the low value resistors 9 and 91 at both ends of the high resistivity polycrystalline silicon film, and the memory consumes electric power in increased amounts. With the conventional high-resistance structure, therefore, it is not desirable to decrease the length l, making it difficult to scale down the device. Namely, the above-mentioned high-resistance structure is not suited for highly integrated static memory cells.

(2) Ceramic materials and resin materials used for packaging the memory elements and inter-connection materials contain trace amounts of uranium U and thorium Th. As a memory cell is hit by alpha particles that are generated when the uranium U or thorium Th decays, electron-hole pairs are generated along the projected range of alpha particles and are combined with the charge stored in the storage nodes. Therefore, the data of the memory is not held any more, and is destroyed. Such a phenomenon is called soft error.

In the conventional static memory, extinction of electric charge caused by alpha particles is compensated by parasitic capacities such as pn junction capacity formed between an $n^+$-type diffusion layer of the drain region and a p-type substrate of the field-effect transistor and insulating film capacity such as of gate oxide film. As the area of the memory cell decreases, however, the stored electric charge is not sufficient to compensate for the extinction of electric charge caused by alpha particles. Therefore, the rate of soft error increases with the decrease in the size of the conventional static memory cells, and reliability of the memory is markedly deteriorated.

SUMMARY OF THE INVENTION

An object of the present invention is to provide a static random access memory which eliminates the above-mentioned problems inherent in the conventional art, and which does not permit the data to be destroyed even when it is hit by alpha particles.

Another object of the present invention is to provide a static random access memory having a large capacitance in the capacitor node.

A further object of the present invention is to provide a static random access memory having a high resistivity load and a capacitor of small required areas.

A still further object of the present invention is to provide a static random access memory having a high resistivity load and a capacitor, which requires a small area.

In order to achieve the above-mentioned objects, the present invention employs, first, a memory cell in which a capacitor is positively added to the capacitor node of SRAM. The added capacitor is provided by forming at least two polycrystalline silicon films with a thin insulating film sandwiched therebetween. The two polycrystalline silicon films further form a folded high resistivity load in the static memory cell.

According to the present invention, furthermore, the high resistivity load and the capacitor may be separately provided from each other, or may be formed as a unitary structure. The device in which these elements are separately provided, enables the applied voltage for the capacitor plate to be freely selected. When these elements are formed as a unitary structure, fine machining is not required, and the device can be realized in a highly integrated form.

These and other objects and many of the attendant advantages of this invention will be readily appreciated as the same becomes better understood by reference to the following detailed description when considered in connection with the accompanying drawings.

DETAILED DESCRIPTION OF THE INVENTION

The invention will now be described in detail by way of embodiments.

Embodiment 1

Figure 1:
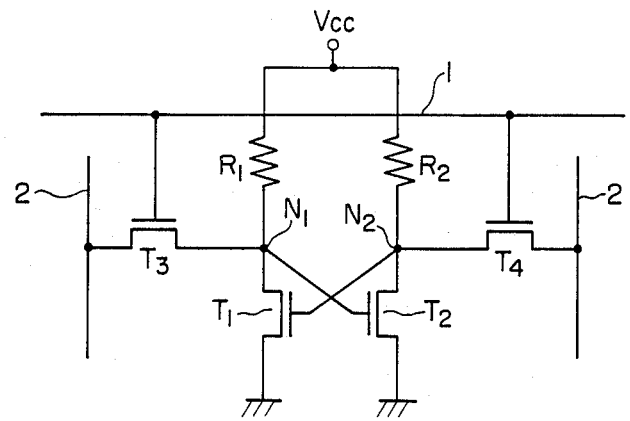
FIGS. 1 and 2 are a circuit diagram and a section view showing prior art.
Figure 2:
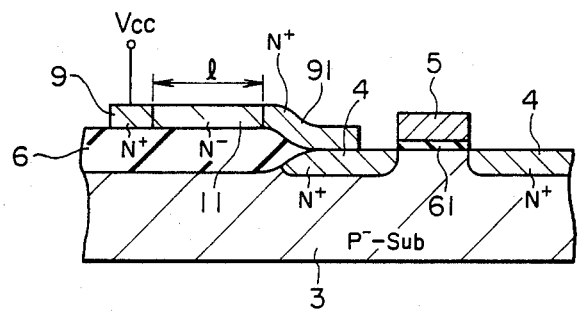
Figure 3:
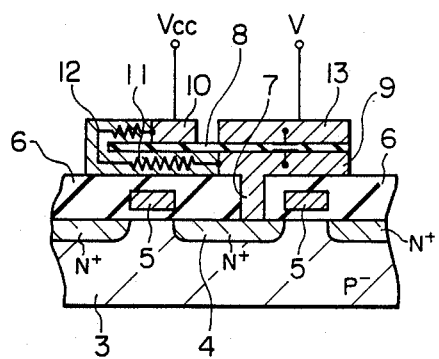
FIGS. 3 to 6 are diagrams illustrating a first embodiment of the present invention.
Figure 4:
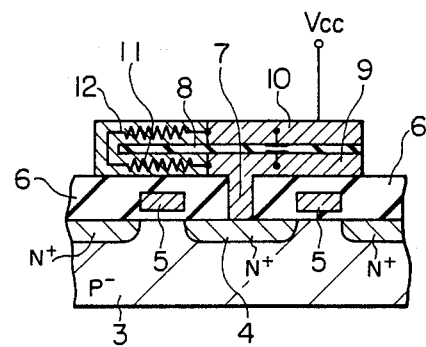

FIGS. 3 and 4 are diagrams which schematically illustrate in cross section the structure of a high value resistor and a capacitor in a static MOS memory cell according to an embodiment of the present invention. In the embodiment of FIG. 3, a terminal 13 of the capacitor may be biased at a power supply voltage, ground level, or any voltage V between them. In the embodiment of FIG. 4, the power supply voltage Vcc is applied to the capacitor. In the embodiment of FIGS. 3 and 4, an electrode 10 at an end of the high value resistor is biased at the power supply voltage Vcc. In the embodiment of FIG. 3, the high resistivity load consists of high resistivity polycrystalline silicon films 11 and 12 which are folded into two layers. With the power supply voltage being applied to the low resistivity area 10, a small current required for the static memory is supplied from a contact hole 7 to the source or drain region 4 of the MOS transistor through polycrystalline high resistivity areas 12, 11 and a low resistivity area 9. The capacitor consists of polycrystalline low resistivity areas 9, 13 and a thin insulating film 8, and is biased at a voltage V. An electric charge necessary for suppressing the soft error is stored in the capacitor which consists of the polycrystalline low resistivity area 13, the polycrystalline low resistivity area 9 connected to the source or drain region 4 of the MOS transistor, and the thin insulating film 8 interposed therebetween.

In the embodiment shown in FIG. 4, the high resistivity load consists of high resistivity polycrystalline silicon films 11 and 12 like that of FIG. 3. The capacitor consists of the low resistivity area 9 formed at an end of the high resistivity polycrystalline silicon film 11, the low resistivity area 10 formed at an end of the high resistivity polycrystalline silicon film 12, and the insulating film 8. With the power supply voltage Vcc being applied to the low resistivity area 10 at the end of the high resistivity polycrystalline silicon film 12, a small current is supplied to the source or drain region 4 of the MOS transistor through the high resistivity polycrystalline silicon films 11 and 12, and a storage charge occurs in the low resistivity areas 9 and 10 at the ends of the high resistivity polycrystalline silicon films 11, 12 via the insulating film 8.

Since the high resistivity load is folded into two layers as described above, the required area on the silicon substrate is greatly reduced, and the effective length of the high resistivity area can be increased. Moreover, the low resistivity area 9 at the end of the high resistivity polycrystalline silicon film 11 connected to the source or drain region 4 of the MOS transistor, further serves as an electrode of the capacitor. Compared with the case where the high resistivity load and the capacitor are independently formed, therefore, the required area on the silicon substrate can be reduced. Moreover, by simply providing low resistivity areas at the ends of high resistivity polycrystalline silicon films formed in two layers with an insulating film interposed therebetween, there can be formed both the high resistivity load and the capacitor, contributing to simplifying the fabrication process.

Figure 5:
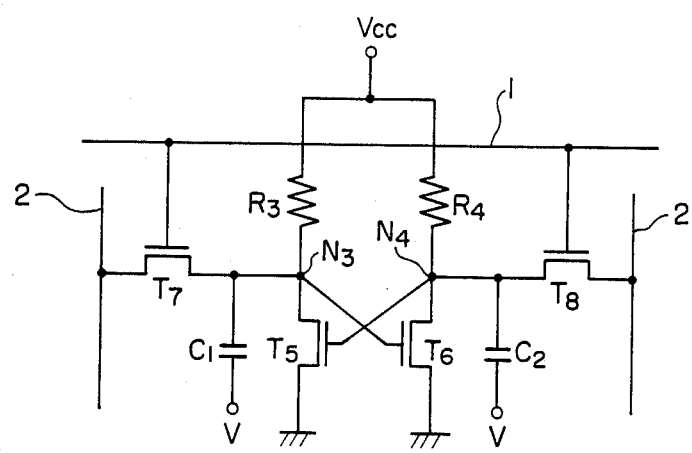

FIG. 5 shows an equivalent circuit of a static memory cell of the structure shown in FIG. 3. In FIG. 5, to the storage nodes $N_3$, $N_4$ of the memory cell are connected the drains of driver MOS transistors $T_5$, $T_6$, the sources of transfer MOS transistors $T_7$, $T_8$, high resistivity loads $R_3$, $R_4$, and capacitors $C_1$ and $C_2$. The capacitors $C_1$ and $C_2$ are biased for example, at the power supply voltage Vcc, ground level Vss, or a voltage between them V, and the storage nodes $N_3$ and $N_4$ have an increased storage capacitance. Therefore, even when the electric charges in the storage nodes $N_3$, $N_4$ are reduced as a result of being hit by alpha particles as mentioned earlier and the potential of the storage node is varied, the electric charges stored in the capacitors $C_1$, $C_2$ are still left and the data stored in the memory is seldom lost.

Figure 6:
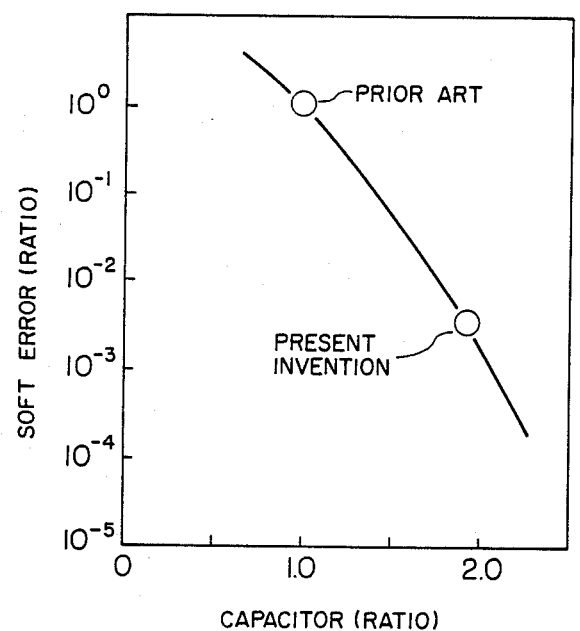

FIG. 6 shows a relationship between the storage capacity and the soft error in the storage nodes of a static memory cell according to the present invention in comparison with that of a conventional static memory cell. According to the present invention as will be obvious from FIG. 6, the electrostatic capacitance at the storage nodes becomes about two times as great as that of the conventional static memory cell despite the fact that the memory cell area is reduced. Therefore, the soft error rate can be improved by more than hundreds of times. That is, the high resistivity load and the capacitor can be formed by using polycrystalline silicon films in two layers, enabling the area of the static memory cell to be reduced. Moreover, the number of fabrication steps can be decreased compared with when the high resistivity load and the capacitor are independently formed.

Embodiment 2

This embodiment deals with a static memory cell which employs the high resistivity load and the capacitor of the above-mentioned embodiment 1, and in which the electrode on the capacitor is biased at a potential other than the power supply voltage, i.e., biased at the ground level or with a potential one-half the power supply voltage.

Figure 7A:
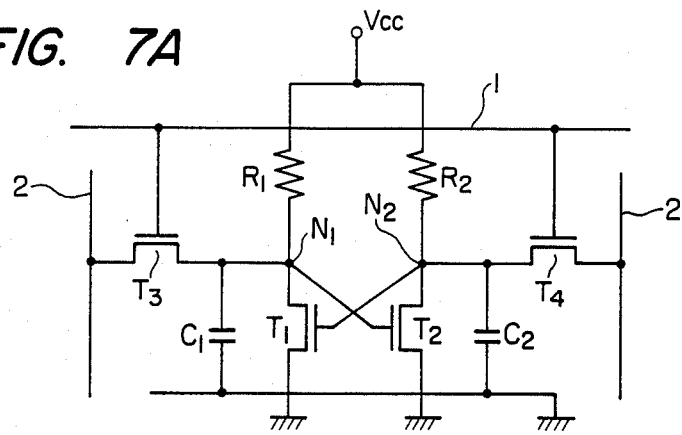
FIGS. 7A to 10H are diagrams illustrating a second embodiment of the present invention.
Figure 7B:
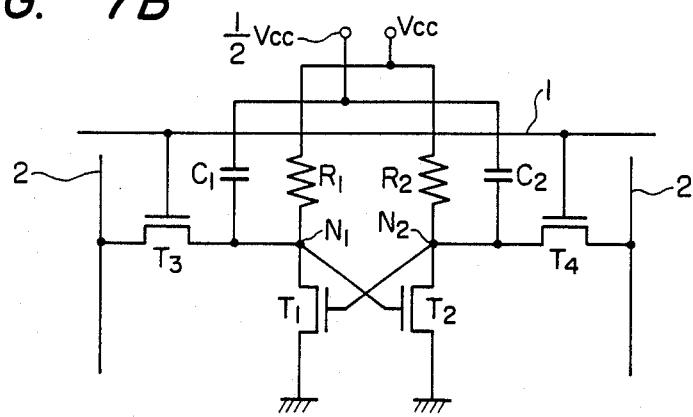

FIGS. 7A and 7B are diagrams of equivalent circuits of static memory cells of when the ground level and a voltage of one-half the power supply voltage are applied to the electrodes on the capacitors $C_1$, $C_2$. In the equivalent circuit of FIG. 7A, first, the capacitors $C_1$, $C_2$ are connected to the storage nodes $N_1$, $N_2$, the other ends of the capacitors $C_1$, $C_2$ being maintained at the ground level connected to the ground potential. In the equivalent circuit of FIG. 7B, the capacitors $C_1$, $C_2$ are connected to the storage nodes $N_1$, $N_2$ as mentioned above. In this case, however, the other ends of the capacitors $C_1$, $C_2$ are maintained at a voltage one-half the power supply voltage.

Figure 8:
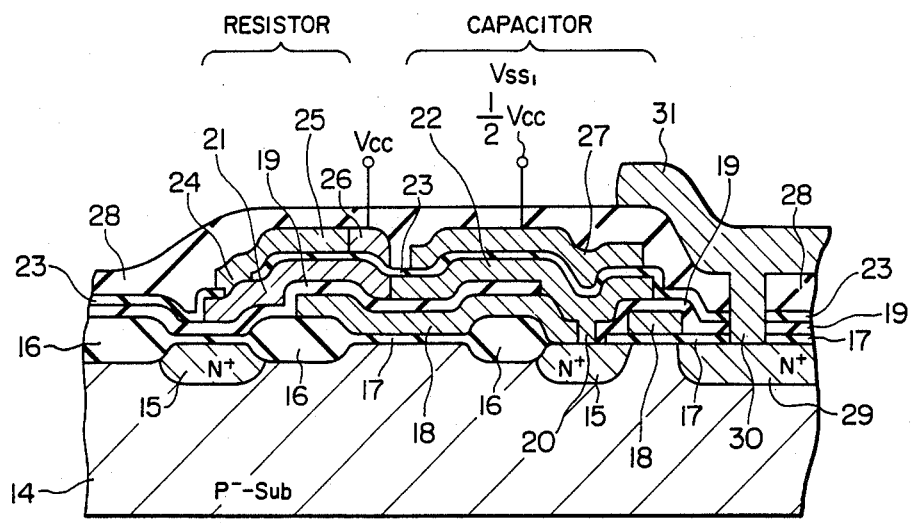

FIG. 8 is a diagram illustrating in cross section the structure of the static memory according to this embodiment, wherein a MOS transistor having a gate electrode 18 and a source or drain region 15 is formed on a silicon substrate 14. The individual transistors are electrically isolated from one another by an insulating film 16 such as of $SiO_2$ having a thickness of 300 to 1000 nm. On these MOS transistors is formed an insulating film 19 such as of $SiO_2$ maintaining a thickness of 50 to 1000 nm.

A contact hole 20 is formed in the insulating film 19 on the source or drain region 15 of some of the MOS transistors. On the insulating film 19 is formed a first high resistivity polycrystalline silicon layer 21 maintaining a thickness of 10 to 1000 nm, and impurities such as arsenic ions are put into a portion thereof at a concentration, of $10^{18}$ to $10^{21}$ cm$^{-3}$ to form a low resistivity area 22. The low resistivity area 22 forms an ohmic contact with respect to the source or drain region 15 through the contact hole 20. On the high resistivity polycrystalline silicon film 21 and the low resistivity area 22 are formed, via an insulating film 23 such as of $Si_3N_4$ and $SiO_2$ of a thickness of 5 to 100 nm, a second high resistivity polycrystalline silicon film 25 of a thickness of 10 to 1000 nm and a low resistivity area 27 which contains impurities such as arsenic ions at a concentration of $10^{18}$ to $10^{21}$ cm$^{-3}$ having a thickness of 10 to 1000 nm. A low resistivity area 26 is also formed at an end of the high resistivity polycrystalline silicon film 25. A contact hole 24 is formed in the insulating film 23 at the end of the high resistivity polycrystalline silicon films 21, 25. The first high resistivity polycrystalline silicon film 21 and the second high resistivity polycrystalline silicon layer 25 are directly connected to each other through the contact hole 24. The power supply voltage Vcc is supplied to the low resistivity area 26 of the high resistivity polycrystalline silicon film 25, and a voltage one-half the power supply voltage or the ground potential Vss is supplied to the low resistivity area 27. The voltage applied to the low resistivity area 27 may be equal to the power supply voltage $Vcc_1$ or may assume any other value. The high resistivity polycrystalline silicon films 21, 25 of FIG. 8 constitute high resistivity loads $R_1$ and $R_2$ of a static memory cell shown in FIGS. 7A and 7B, and the low resistivity area 22 at the end of the polycrystalline silicon film 21, insulating film 23, and low resistivity area 27 of FIG. 8 constitute the capacitors $C_1$ and $C_2$ of the static memory cell shown in FIGS. 7A and 7B. On the high resistivity load and the capacitors is further formed an insulating film 28 such as of $SiO_2$ maintaining a thickness of 50 to 2000 nm. A contact hole 30 that communicates with the drain diffusion layer 29 is formed in the insulating films 17, 19, 23 and 28 on the drain diffusion layer 29 of the transfer MOS transistor. Through the contact hole is formed an aluminum interconnection 31 which is a data line having a thickness of 50 to 2000 nm.

Figure 9:
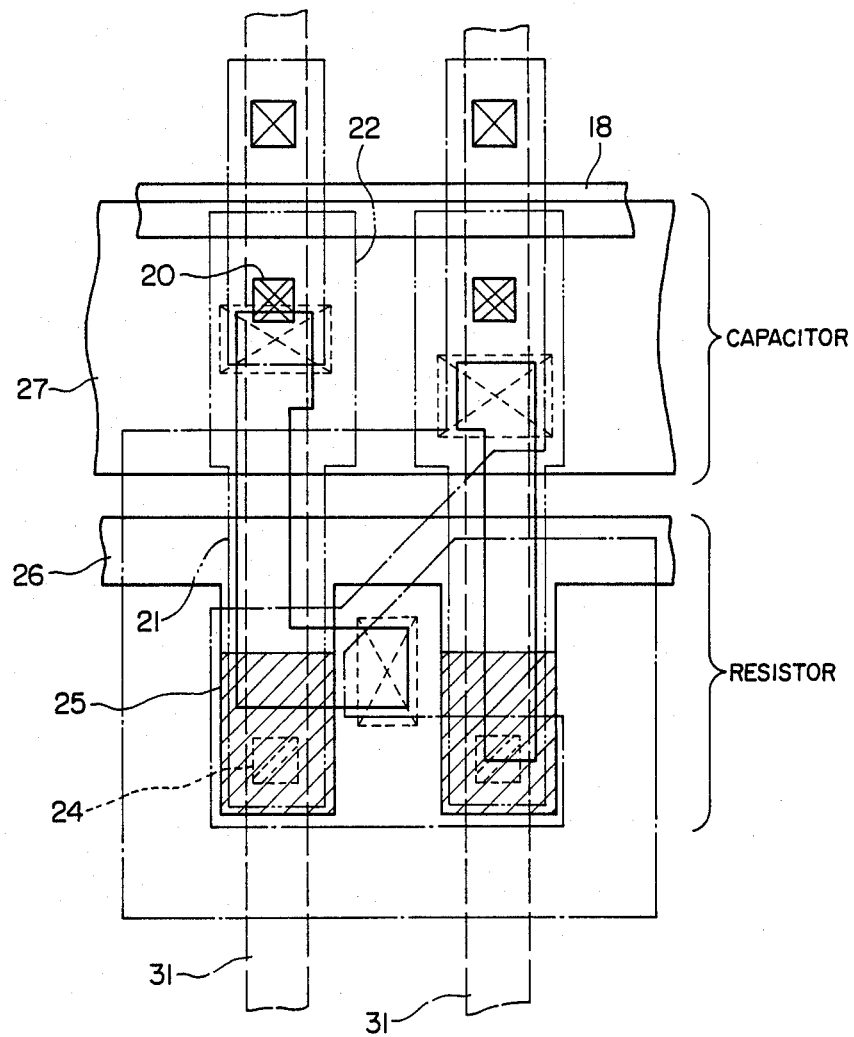

FIG. 9 shows the layout of the static memory cell according to this embodiment, wherein the high resistivity area 21 without containing impurities is formed on the first polycrystalline silicon film 22 (indicated by a two-dot chain line). The second polycrystalline silicon film (solid line) forms the upper film 26 of the folded resistor and an upper electrode 27 of the capacitor. In the polycrystalline silicon film 26 is formed the high resistivity area 25 which does not contain impurities. The polycrystalline high resistivity areas 21, 25 of the first and second polycrystalline silicon films are connected to each other via the contact hole 24. The capacitor is formed in a portion where the first polycrystalline silicon film 22 is overlapped on the second polycrystalline silicon layer 27. Further, the first polycrystalline silicon film 22 forms the low resistivity area except the high resistivity area 21, and is ohmic-connected to the drain region of the MOS transistor via the contact hole 20. The polycrystalline silicon film 27 works as a plate which applies the ground level or a voltage one-half the power supply voltage to the capacitor. The polycrystalline silicon film 26 is used as an interconnection for applying the power supply voltage Vcc to the high resistivity load. The word line is formed by a gate electrode 18 such as of polycrystalline silicon, silicide or a metal, and the data line is formed by a metal 31 such as aluminum.

In FIG. 9, a dot-dash chain line represents diffusion layers, a solid line represents gate electrodes, squares of a broken line with diagonal lines represent portions where the diffusion layer and the gate electrode are connected together, and squares of a solid line with diagonal lines represent portions where the diffusion layer and the aluminum electrode are connected together.

Figure 10A:
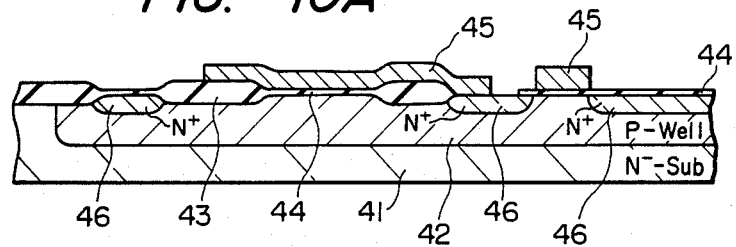
Figure 10B:
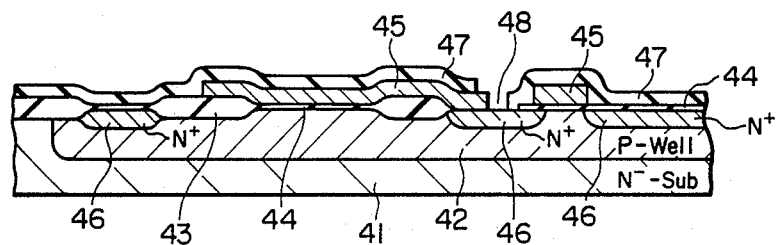
Figure 10C:
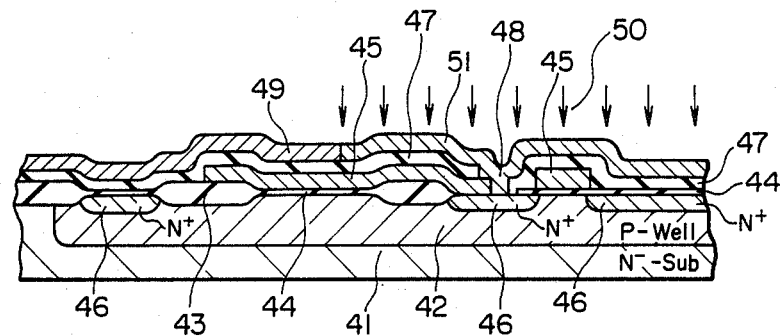
Figure 10D:
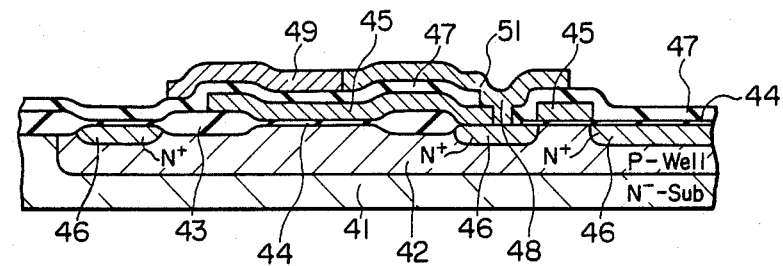
Figure 10E:
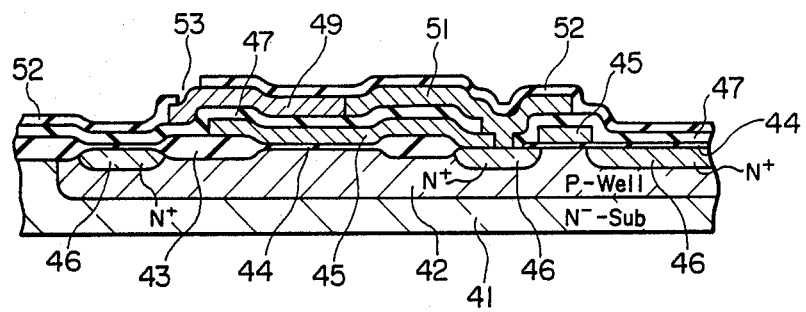
Figure 10F:
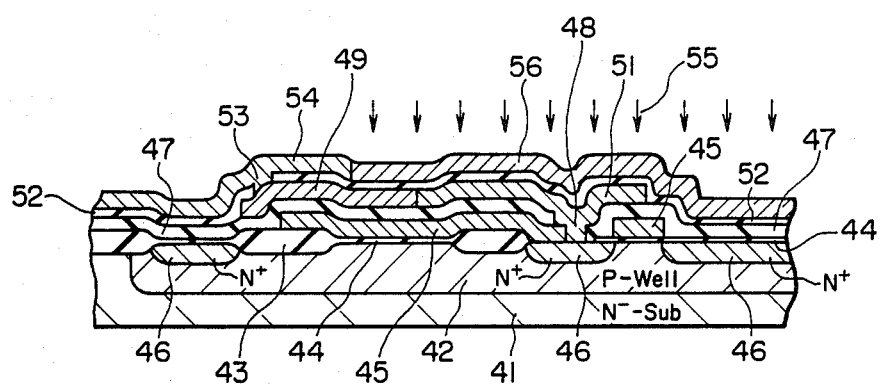
Figure 10G:
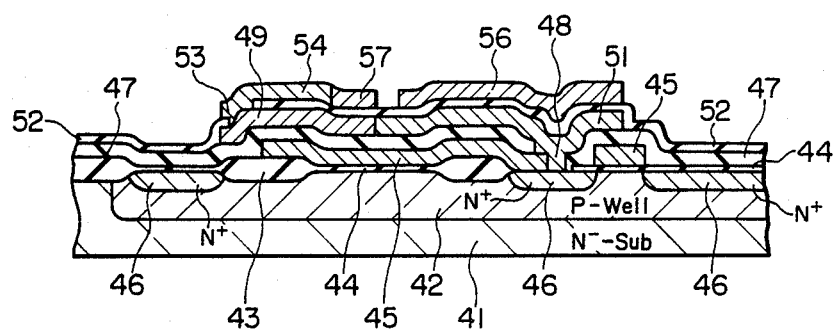
Figure 10H:
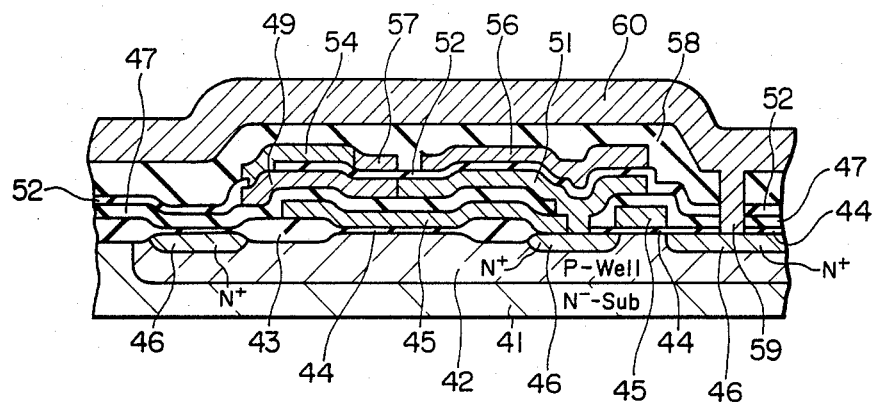

FIGS. 10A to 10H illustrate a process for fabricating the static memory cell according to the embodiment 2. First, in an n-type silicon substrate 41 having an impurity concentration of about $10^{15}$ to $10^{16}$ cm$^{-3}$ is formed a p-type well 42 which has an impurity concentration of $10^{15}$ to $10^{17}$ cm$^{-3}$ and a depth of 2 to 5 $\mu$m by the ion implantation or by the thermal diffusion. Then, a field oxide 43 is formed maintaining a thickness of 300 to 1000 nm on the surface of the silicon substrate by the selective oxidation method. A thin gate oxide 44 is formed for maintaining a thickness of 5 to 100 nm, and a gate electrode 45 is formed which consists of polycrystalline silicon, a silicide or a metal. Then, the n-type impurities such as phosphorus ions or arsenic ions are implanted at a concentration of $10^{15}$ to $10^{16}$ cm$^{-2}$, followed by the annealing at a temperature of 500° to 1000° C. to form an n$^+$-type region 46 of the MOS transistor (FIG. 10A). Then, an $SiO_2$ film 47 is formed by the chemical vapor deposition (CVD method) maintaining a thickness of 50 to 1000 nm. A contact hole 48 is formed by dry etching in the $SiO_2$ 47 on the n$^+$-type doped region 46 of the MOS transistor (FIG. 10B). A first high resistivity polycrystalline silicon film 49 is deposited by the CVD method maintaining a thickness of 10 to 1000 nm, and impurities 50 such as phosphorus ions or arsenic ions are put into a region where a capacitor is to be formed at a concentration of $10^{18}$ to $10^{21}$ cm$^{-3}$ to thereby form a low resistivity area 51 (FIG. 10C). The polycrystalline silicon films 49 and 51 are patterned by the photolithography (FIG. 10D). The impurites can be doped the polycrystalline silicon by the method of ion implantation or by the method of thermal diffusion, or by depositing a source for diffusing impurities followed by the thermal drivein method. Here, however, the ion implantation method is suited for forming a scaled high resistivity load since the distance of diffusion in the lateral direction is short in the polycrystalline silicon. Next, an $Si_3N_4$ film 52 is deposited by the CVD method maintaining a thickness of 5 to 100 nm. Thereafter, an oxide is formed maintaining a thickness of 5 to 50 nm on the surfaces of the $Si_3N_4$ film 52, and a contact hole 53 is formed by dry etching in the $Si_3N_4$ film 52 at the end of the high resistivity polycrystalline silicon film 49 and the thermally oxidized film on the $Si_3N_4$ film 52 (FIG. 10E). Then, a second high resistivity polycrystalline silicon film 54 is deposited by, for example, the CVD method maintaining a thickness of 10 to 1000 nm, and impurities such as phosphorus ions or arsenic ions are selectively doped at a concentration of $10^{18}$ to $10^{21}$ cm$^{-3}$ into the region where the capacitor is to be formed and into the region where the low resistivity area is to be formed at an end of the high resistivity load, thereby to form a low resistivity area 56 like in the first polycrystalline silicon film (FIG. 10F). Thereafter, the polycrystalline silicon films 54, 56 and 57 are patterned by the photolithography (FIG. 10G). The low resistivity region 56 of the polycrystalline silicon film serves as a plate to which is applied the ground level or a voltage one-half the power supply voltage. The low resistivity region 57 serves as an inter-connection for supplying the power supply voltage to the high resistivity load. Then, an $SiO_2$ layer 58 is deposited by the CVD method maintaining a thickness of 50 to 2000 nm. A contact hole 59 that communicates with the n-type diffusion layer 46 is formed in the $SiO_2$ films 44, 47, 52 and 58 on the n-type diffusion layer 46 of the MOS transistor, and a metal inter-connection 60 is formed maintaining a thickness of 50 to 2000 nm (FIG. 10H). Though this embodiment has dealt with a process for fabricating a static memory having an n-channel MOS transistor in the p-type well, a static memory cell can also be formed in the same manner as above having a p-channel MOS transistor in the n-type well. It can be understood that the well structure needs not be necessarily used. It is further allowable to realize the CMOS structure by forming an n-channel MOS transistor in the p-type well and forming a p-channel MOS transistor in the n-type well.

According to the second embodiment of the present invention, when the capacitor plate (upper electrode) is served with the power supply voltage, fluctuation in the power supply voltage Vcc caused by the operation of the device affects the amount of electric charge stored in the capacitor thereby to worsen the soft error rate. The effect, however, can be decreased if the ground level or the voltage ½ Vcc is applied to the plate.

Embodiment 3

This embodiment is concerned with a method of supplying electric power to the high resistivity loads and to the capacitors.

Figure 11:
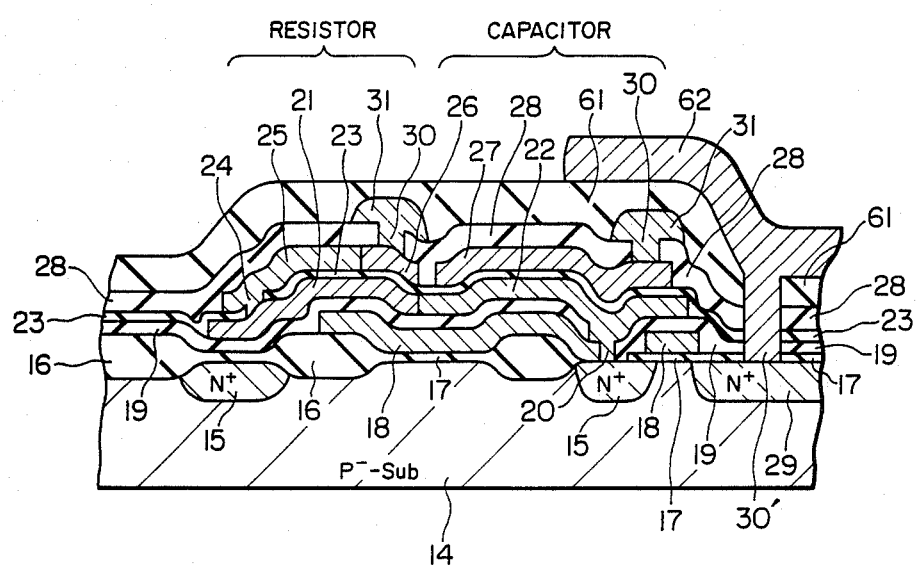
FIGS. 11 and 12 are diagram illustrating a third embodiment of the present invention.

FIG. 11 is a diagram which illustrates in cross section the structure of a static memory cell according to this embodiment. A first aluminum interconnection 31 is used to supply the electric power to the high resistivity load and to the capacitor. A data line consists of a second aluminum inter-connection 62. According to this embodiment, the aluminum inter-connection has a resistance smaller than that of the low resistivity polycrystalline silicon film. When the electric power is supplied to the high resistivity load and to the capacitor, therefore, the voltage drops less than that of the embodiment 2. Therefore, the soft error develops little even when the device is hit by the alpha particles, and the memory cell does not erroneously operate even when the power supply voltage is changed.

That is, if the inter-connection for supplying the power supply voltage to the high resistivity load has a large resistance, the voltage drops greatly at the high resistivity load of the memory cell connected to the end of the inter-connection. Therefore, the current is not supplied sufficiently to the high resistivity load to maintain the data, and the data is inverted if the power supply voltage drops even slightly. Further, since the power supply line is connected in series with the capacitor, the resistance of the power supply line works as a loss component. Therefore, the capacity decreases substantially, and the effect of the capacitor (against the alpha particles) decreases.

In FIG. 11, the same reference numerals as those of FIG. 8 denote the same portions as, or equivalent portions to, those of FIG. 8.

In FIG. 11, the aluminum inter-connection 31 is connected to the polycrystalline silicon layers 25, 27 through the contact hole 30.

Figure 12:
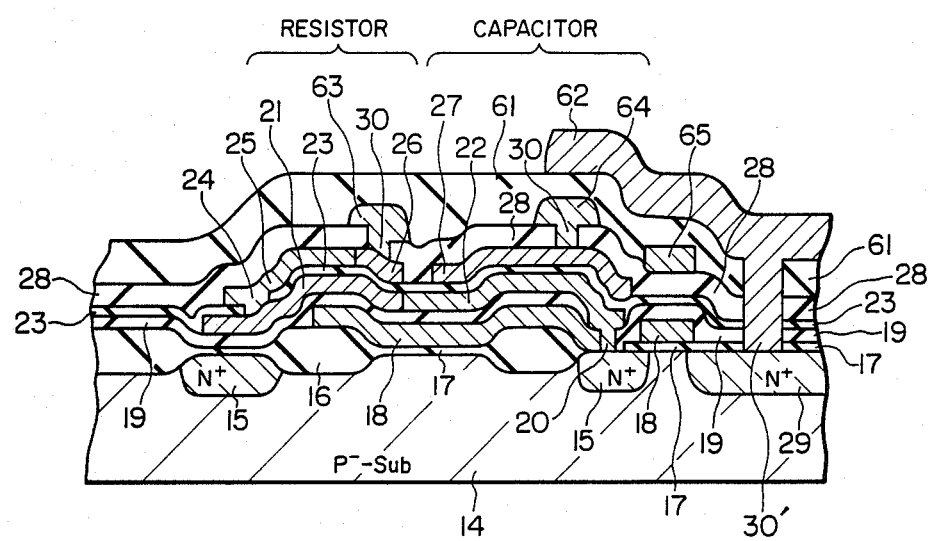

FIG. 12 is a diagram in which the first aluminum inter-connection is used as inter-connections 63, 64 (that were denoted by 31 in FIG. 11) to supply the electric power to the high resistivity load and to the capacitor, and as a divided word line 65 connected in parallel with the word line.

The divided word line 65 stands for a second aluminum inter-connection that is provided to decrease the number of memory cells connected to the word line, and to decrease the capacity parasitic on the word line.

According to the third embodiment of the present invention, an aluminum electrode having a small resistance is used as an inter-connection to supply the electric power to the capacitor and to the high resistivity load. Therefore, (1) the voltage drop caused by the resistance of the inter-connection can be decreased, and the data can be prevented from inverting when the power supply voltage has dropped, and (2) a small resistance that serves as a loss component is connected in series with the capacitor, and the effective (ac) capacity can be prevented from decreasing.

The above-mentioned two points ensure margin (retention characteristics) against the variation of potential, and the soft error rate can be decreased against the alpha particles.

Embodiment 4

This embodiment is concerned with a case in which the power supply voltage is applied to the upper electrode of the capacitor in a static memory cell which employs the high resistivity load and the capacitor of the embodiment 1.

Figure 13:
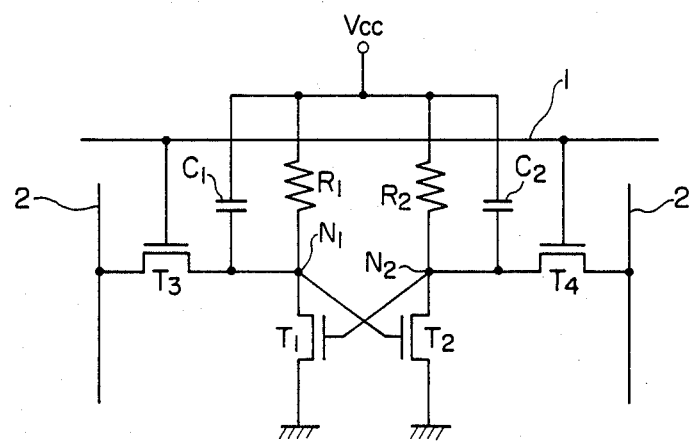
FIGS. 13 to 16H are diagrams illustrating a fourth embodiment of the present invention.

FIG. 13 is a diagram of an equivalent circuit of this embodiment, wherein the power supply voltage Vcc is supplied to the capacitors $C_1$, $C_2$ that are connected to the storage nodes $N_1$, $N_2$.

Figure 14:
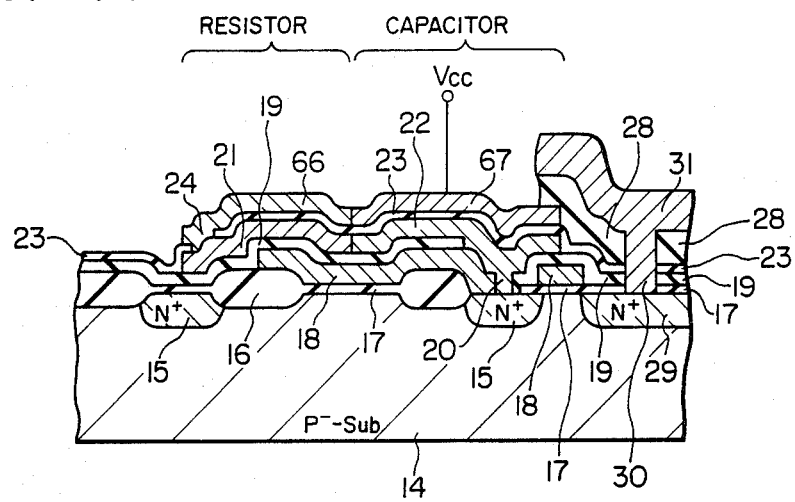

FIG. 14 shows in cross section the structure of a static memory which has an equivalent circuit of FIG. 13. FIG. 14 is the same as FIG. 8 except for the second polycrystalline silicon layers 66 and 67. That is, as shown in FIG. 13, the power supply voltage Vcc is supplied to the high resistivity load and to the plate which is the upper electrode of the capacitor. In the memory cell shown in FIG. 14, therefore, the low resistivity area 67 at an end of the second high resistivity polycrystalline silicon layer 66 can also be used as the power supply plate of the capacitor. This eliminates the need of dividing the polycrystalline silicon layer into two, and contributes to miniaturizing the memory cell area. The power supply voltage Vcc is supplied to the low resistivity area 67 of the second polycrystalline silicon layer. The high resistivity polycrystalline silicon layers 21 and 66 of FIG. 14 constitute the high resistivity loads $R_1$ and $R_2$ in the static memory cell of FIG. 13. The first low resistivity area 22, the second low resistivity area 67 and the insulating film 23 of FIG. 14 constitute the capacitors $C_1$ and $C_2$ in the equivalent circuit of static memory cell shown in FIG. 13.

Figure 15:
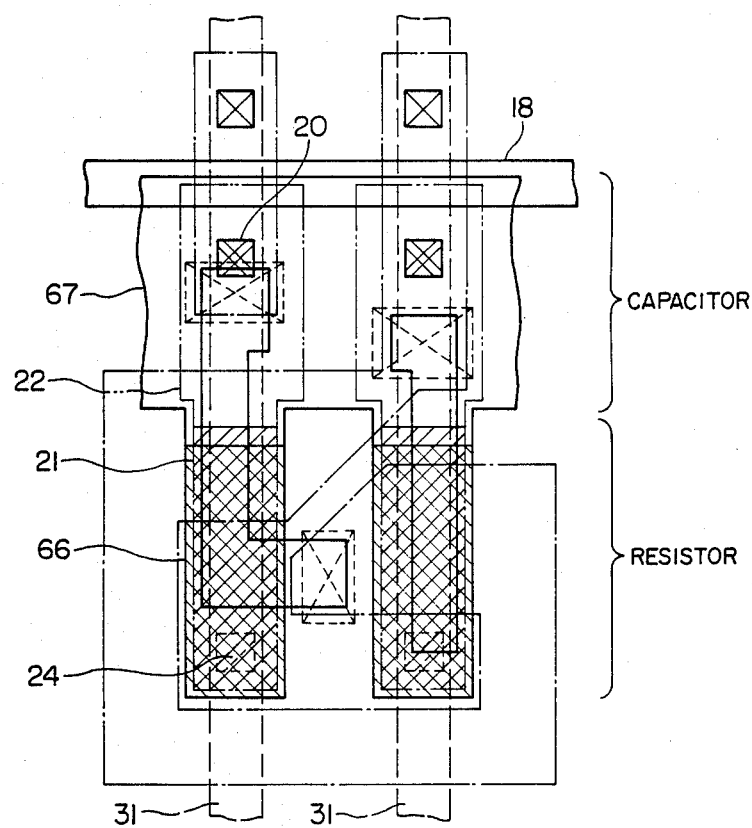

FIG. 15 is a plan view showing the layout of the static memory cell according to this embodiment, wherein the high resistivity area 21 without containing impurities is formed in the first polycrystalline silicon layer 22. The resistivity area 66 without containing impurities is formed in the second polycrystalline silicon layer 67. The structure of FIG. 15 is the same as that of FIG. 9 except the second polycrystalline silicon layers 66 and 67. The polycrystalline silicon layer 67 has a small resistance and serves as a plate to supply the power supply voltage to the capacitor and as an interconnection to supply the power supply voltage to the high resistivity load.

Figure 16A:
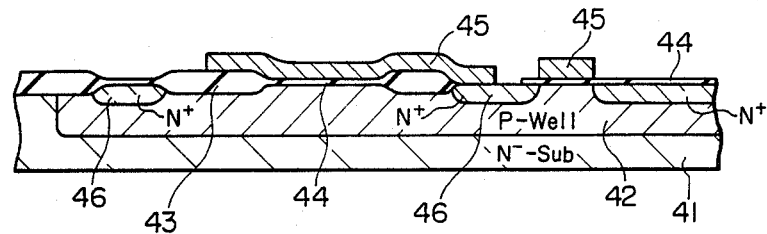
Figure 16B:
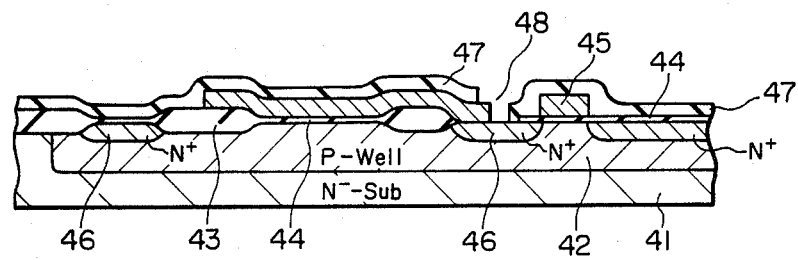
Figure 16C:
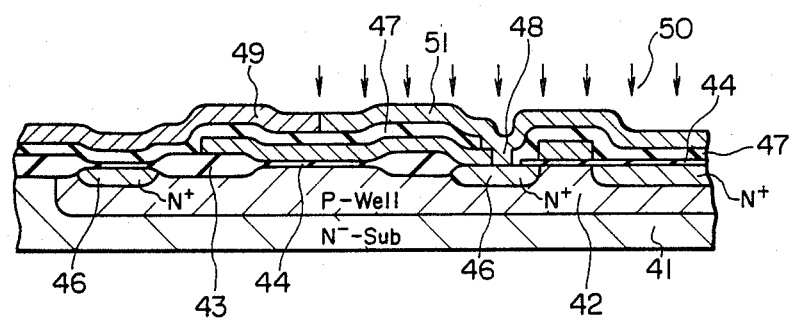
Figure 16D:
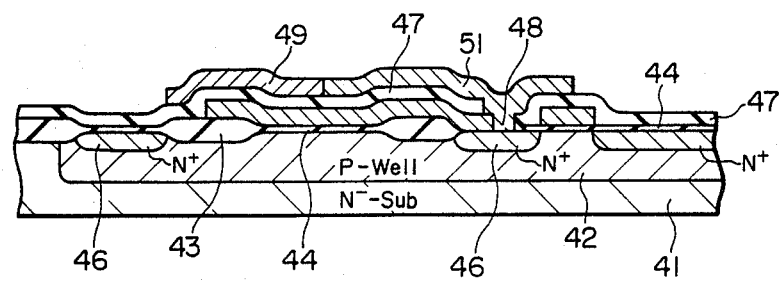
Figure 16E:
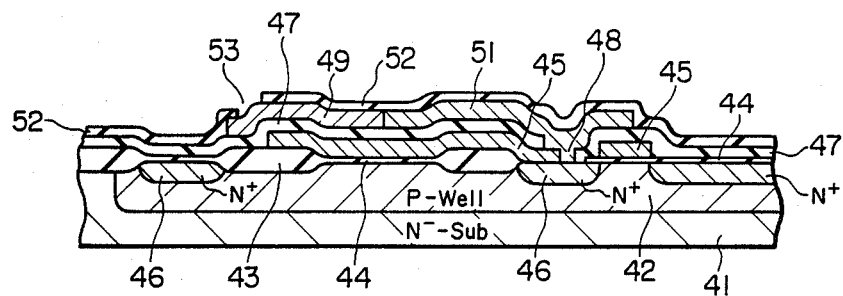
Figure 16F:
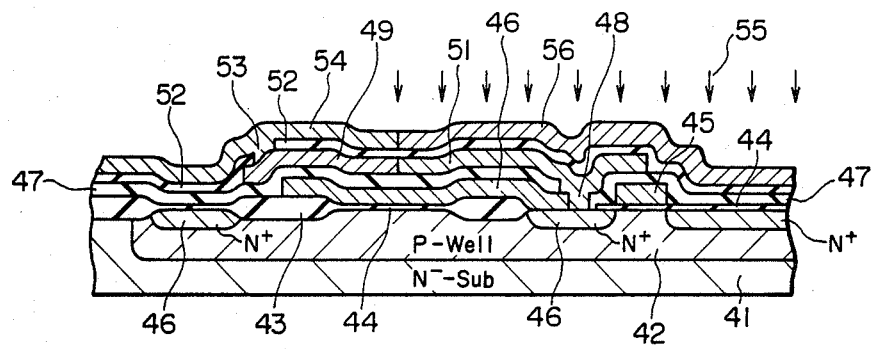
Figure 16G:
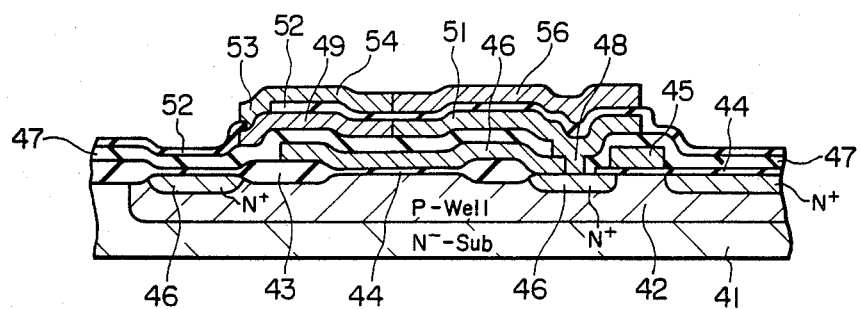
Figure 16H:
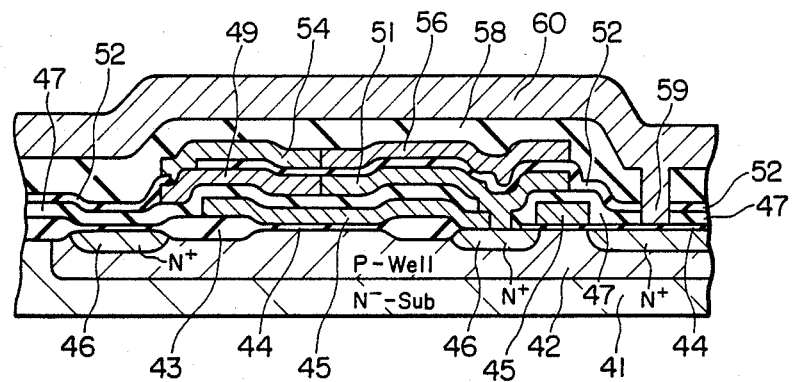

FIGS. 16A to 16H are diagrams showing a process for fabricating the static memory cell according to this embodiment, which process being nearly the same as the manufacturing process shown in FIGS. 10A to 10H. However, what makes a difference from the structure shown in FIGS. 10A to 10H is that the second polycrystalline silicon layer is not divided into the resistor 54 and the capacitor 56 (FIG. 16G). Therefore, the required area can be decreased.

As far as the static memory of the type in which the power supply voltage is applied to the plate is concerned according to this embodiment, the device can be regarded to have the structure in which part of the high resistivity load serves as a capacitor, or to have the structure in which part of the capacitor serves as a high resistivity load. Therefore, there is provided a memory cell of the structure that can be easily produced and that is suited for being highly densely integrated.

As shown in FIG. 12 of the embodiment 3, furthermore, it is also allowable to use the second aluminum layer 62 as the data line and to use the first aluminum layer as the power supply lines 63, 64 and as the divided word line 65.

According to the fourth embodiment of the present invention, the electric power is supplied to the capacitor (Vcc plate only) and to the high resistivity load through the same inter-connection layer (polycrystalline silicon film). Therefore, the fabrication steps and the layout of the device can be simplified compared with other methods ($\frac{1}{2}$ Vcc, Vss plate). Moreover, the device has the structure that can be miniaturized.

Embodiment 5

This embodiment deals with the static memory cell having the structure of the above-mentioned embodiment but in which the source and drain regions of the MOS transistor have a reduced resistance.

Figure 17:
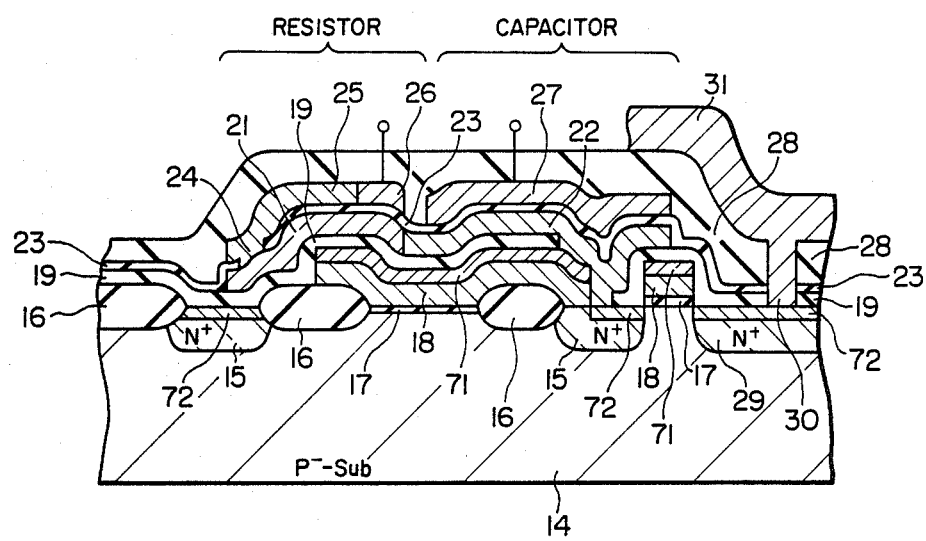
FIGS. 17 to 18D are diagrams illustrating a fifth embodiment of the present invention.

FIG. 17 is a diagram showing in cross section a static memory cell in which silicide films 71, 72 are formed on the source, drain and gate electrodes of the MOS transistor. In FIG. 17, the source and drain regions 15, 29 formed in the silicon substrate 14 are n-type impurity regions. A silicide layer 72 composed of silicon and tungsten, titanium, or the like is formed on the source and drain regions 15, 29. The gate electrode 18 is composed of polycrystalline silicon, and on which is further formed a silicide layer 71 composed of silicon, tungsten or the like. According to this embodiment, the resistance of diffusion layers of the source and drain regions 15, 29 of the MOS transistor can be decreased to one-half to one-tenth. The source region having a small resistance of the drive MOS transistor exhibits the effect as described below. That is, since the resistance of the ground line of the static memory cell decreases, the delay time can be shortened at the time of writing the data onto the memory. Moreover, the resistance of the ground inter-connection does not cause the memory to erroneously operate. The gate electrode having a small resistance of the transfer MOS transistor exhibits the effect as described below. That is, since the resistance of the word line decreases, the delay time can be shortened at the time of writing the data onto the memory or reading out the data therefrom. According to this embodiment, furthermore, the feature resides in that the fabrication process for decreasing the resistance of the source and drain regions and of the gate electrode of MOS transistor, is independent from the process for forming the high resistivity load and capacitor, and these fabrication processes impose no limitation relative to each other.

To explain this point in further detail, the fabrication process will now be described with reference to FIGS. 18A to 18D.

Figure 18A:
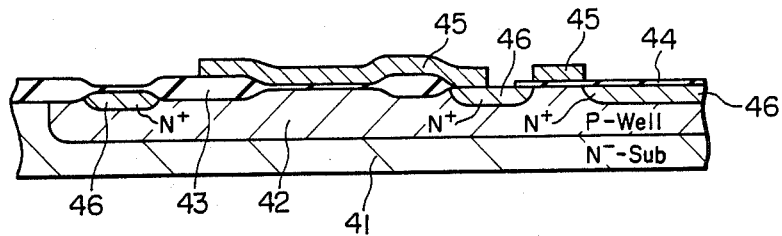
Figure 18B:
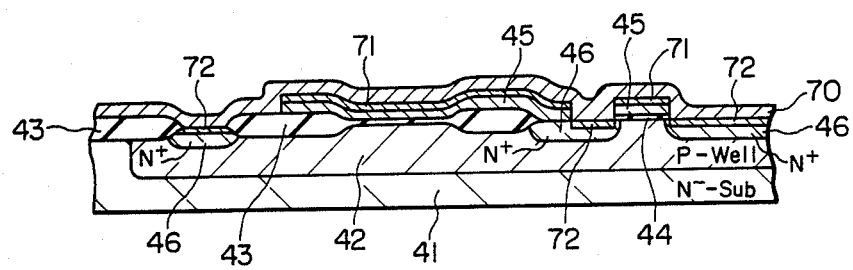
Figure 18C:
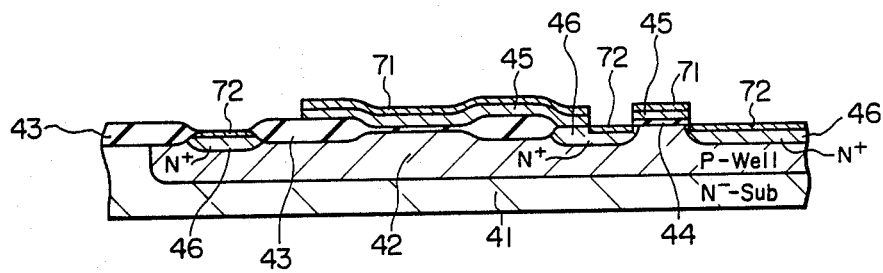
Figure 18D:
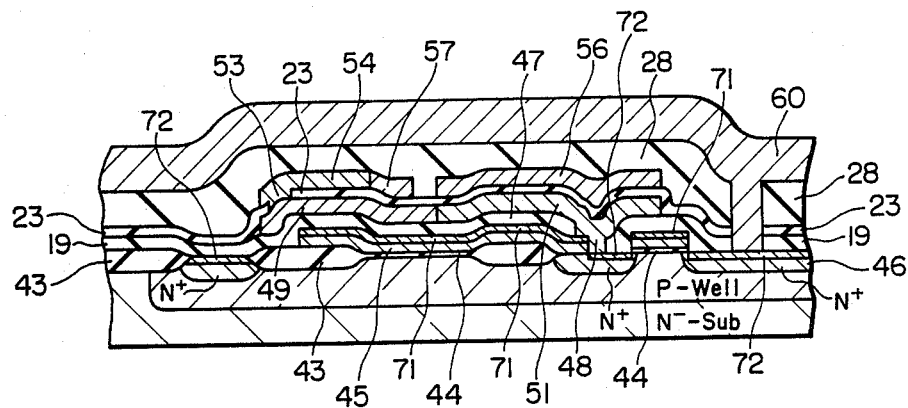

The p-type well 42 is formed in the silicon substrate 41, and the field oxide 43 is formed thereon to constitute an n-channel MOS transistor in the same manner as the step of FIG. 10A. Here, however, the gate electrode 45 is composed of polycrystalline silicon having a thickness of 10 to 500 nm (FIG. 18A). Next, the gate oxide film on the n+-type diffusion layer 46 is etched with hydrofluoric acid. A refractory metal 70 such as tungsten or the like is deposited on the whole surface by the sputtering method or the CVD method maintaining a thickness of 100 to 500 nm. The whole substrate is annealed at 500° C. to 700° C., whereby bare silicon reacts with the refractory metal such as tungsten to form silicide layers 71, 72 (FIG. 18B). Then, the unreacted refractory metal is removed by etching (FIG. 18C). Further, the $SiO_2$ film 47 is deposited maintaining a thickness of 50 to 1000 nm, high resistivity loads and capacitors are formed, and the aluminum inter-connection 60 is formed maintaining a thickness of 100 to 2000 nm (FIG. 18D) quite in the same manner as the steps of FIGS. 10B to 10H. In this embodiment, furthermore, the silicide layer is entirely covered with the $SiO_2$ film 47 except the contact hole 48. Therefore, interference can be greatly reduced between the silicide layer and the polycrystalline silicon layer which forms the capacitors and high resistivity loads, and very small limitation is imposed on the fabrication process.

According to this embodiment, the static memory cell needs not necessarily be limited to the type in which the upper electrode of the capacitor is impressed with the ground level or a voltage one-half the power supply voltage, but may be realized in a type in which the upper electrode of the capacitor is impressed with the power supply voltage as described in the aforementioned embodiment 3. Further, only the source region or the gate electrode may be composed of a silicide. According to the fifth embodiment of the present invention, the invention can be put into practice independently of the fabrication process for decreasing the resistance (silicidation) of the gate electrode and source and drain regions, that causes the circuit operation to be delayed. That is, since the active regions are isolated from the high resistivity areas and capacitors by the $SiO_2$ film formed by the CVD method irrespective of the materials that form the gate electrode and source and drain regions, the fabrication processes do not impose limitation relative to each other, and increased freedom is offered for designing the process.

Embodiment 6

This embodiment is concerned with a static memory cell in which the high resistivity load is formed by the first polycrystalline silicon layer alone.

Figure 19:
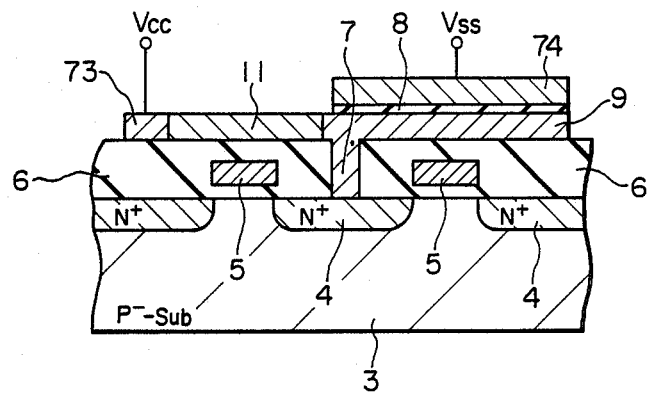
FIGS. 19 to 22D are diagrams illustrating a sixth embodiment of the present invention.
Figure 20:
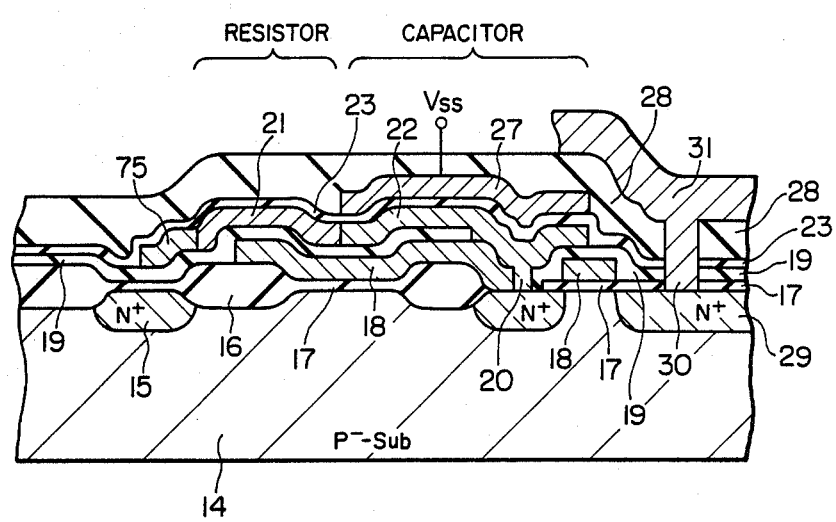
Figure 21:
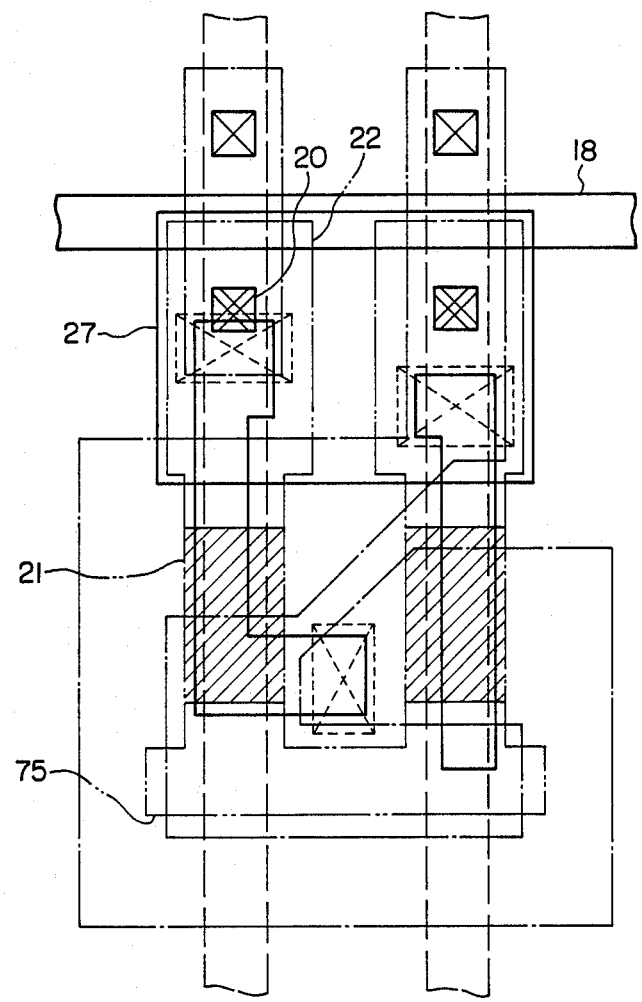
Figure 22A:
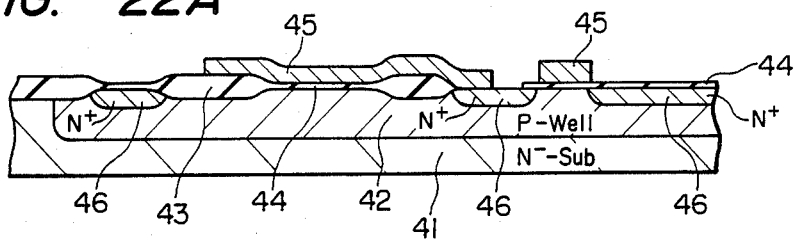
Figure 22B:
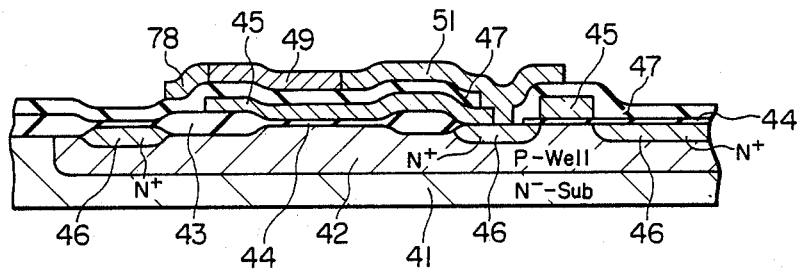
Figure 22C:
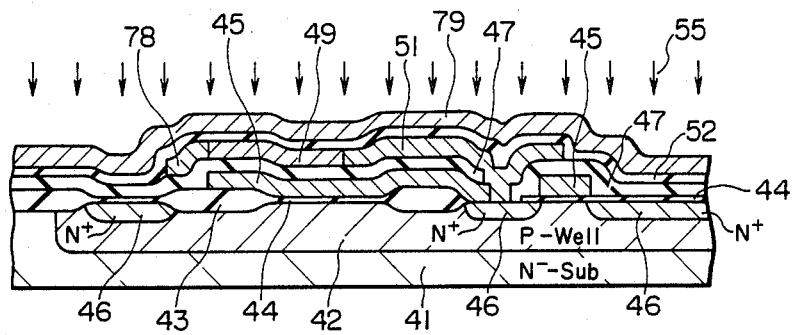
Figure 22D:
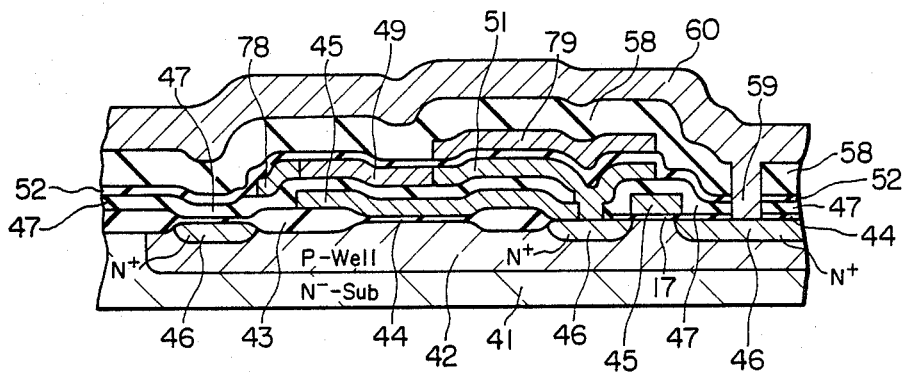

FIG. 19 is a diagram showing in cross section the structure of the high resistivity load and the capacitor according to this embodiment. Namely, FIG. 19 shows the high resistivity load and the capacitor formed on the MOS transistor that constitutes a static memory cell, wherein low resistivity areas 9 and 73 are formed at both ends of a first high resistivity polycrystalline silicon layer 11. The low resistivity area 9 is connected to the source or drain diffusion layer 4 of the MOS transistor. The low resistivity area 73 is served with the power supply voltage Vcc. On the low resistivity area 9 is further formed a second low resistivity polycrystalline silicon layer 74 via an insulator 8 such as SiO$_2$. Therefore, the high resistivity load is constituted by the first high resistivity polycrystalline silicon layer 11, and the capacitor is constituted by the low resistivity area 9 of the first polycrystalline silicon layer, the insulator 8 and the low resistivity area 74 of the second polycrystalline silicon layer. In this embodiment, the capacitor is served with the ground level Vss. However, the capacitor may not be necessarily served with the ground level Vss, but may be served with any voltage. FIG. 20 is a diagram which illustrates in cross section and in further detail the structure of the static memory cell according to this embodiment. In FIG. 20, a low resistivity area 75 is connected to the power supply voltage Vcc to supply the electric power to the high resistivity load. FIG. 21 is a plan view showing the layout of the static memory cell according to this embodiment, wherein low resistivity areas 22, 75 are formed at both ends of the first high resistivity polycrystalline silicon layer 21. On the low resistivity area 22 is formed a capacitor which uses the second low resistivity polycrystalline silicon layer 27 as an opposing electrode. The low resistivity area 75 is used as an inter-connection to the power supply voltage Vcc. FIG. 22 shows a process for producing the static memory cell according to this embodiment. A p-type well 42 is formed in a silicon substrate 41. A MOS transistor is formed in the p-type well (FIG. 22A). Then, an SiO$_2$ film 47 is formed in the same manner as the process explained with reference to FIGS. 10A and 10B. Impurities such as phosphorus ions or arsenic ions are put at a concentration of $10^{18}$ to $10^{21}$ cm$^{-3}$ into both ends of the first high resistivity polycrystalline silicon layer 49 thereby to form low resistivity areas 51 and 78 (FIG. 22B). Then, the surfaces of the polycrystalline silicon layers 49, 51 and 78 are thermally oxidized at 900° to 1000° C. in an oxygen atmosphere to form an oxide maintaining a thickness of 25 to 50 nm, and an Si$_3$N$_4$ layer having a thickness of 5 to 100 nm and a second polycrystalline silicon layer 79 having a thickness of 10 to 1000 nm are deposited thereon in order to decrease the resistance (FIG. 22C). The second polycrystalline silicon layer 79 is patterned by etching, the SiO$_2$ film 58 is formed, the contact hole 59 is formed, and the aluminum electrode 60 is formed (FIG. 22D) in the same manner as the steps of FIGS. 10G and 10H. According to the sixth embodiment of the present invention, the first and second polycrystalline silicon layers are not connected at the ends, enabling the manufacturing process to be simplified. However, the memory cell has an area greater than that of the embodiment 1.

Embodiment 7

Figure 23A:
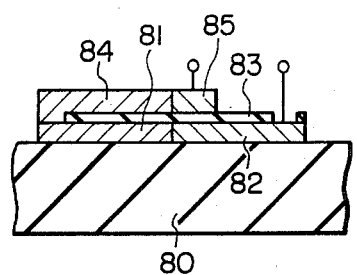
FIGS. 23A to 27D are diagrams illustrating a seventh embodiment of the present invention.
Figure 23B:
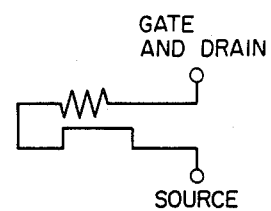

This embodiment is related to a method of suppressing the effect of electric field upon the high resistivity load. FIGS. 23A and 23B are to explain the effect of electric field upon the high resistivity load, wherein FIG. 23A is a schematic section view of the high resistivity load in the static memory cell, and FIG. 23B is a diagram of an equivalent circuit thereof. In FIG. 23A, the power supply voltage Vcc is supplied to a low resistivity area 85 of the second high resistivity polycrystalline silicon layer 84. The current flows from the low resistivity area 85 of the second high resistivity polycrystalline silicon layer 84 to a low resistivity area 82 of a first high resistivity polycrystalline silicon layer 81 through the second high resistivity polycrystalline silicon layer 84 and the first high resistivity polycrystalline silicon layer 81. Therefore, the second high resistivity polycrystalline silicon layer 84 has a potential higher than that of the first high resistivity polycrystalline silicon layer 81. Accordingly, the first high resistivity polycrystalline silicon layer 81 is affected by the electric field established by the second high resistivity polycrystalline silicon layer 84, and its electric conductivity is modulated. FIG. 23B is a diagram which expresses the electric field effect using a symbol that resembles the symbol of the MOS transistor. The low resistivity area 82 of the first layer serves as a source, the low resistivity area 85 of the second layer serves as a drain, and the high resistivity area 84 serves as a gate.

Figure 24:
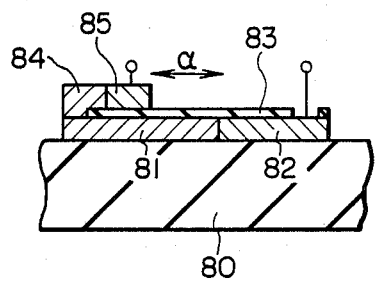
Figure 25:
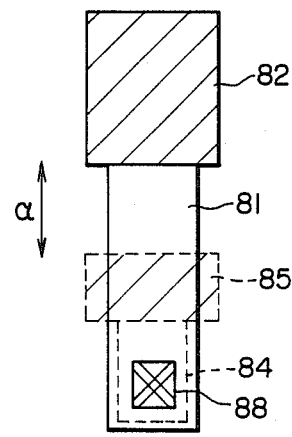

FIG. 24 shows the structure of the embodiment to suppress the electric field effect, and FIG. 25 is a plan view showing the layout thereof. In the embodiment shown in FIGS. 24 and 25, the distance d is increased between the low resistivity area 82 of the first layer and the low resistivity area 85 of the second layer to maintain a region that prevents the high resistivity polycrystalline silicon layer from being affected by the electric field.

Figure 26:
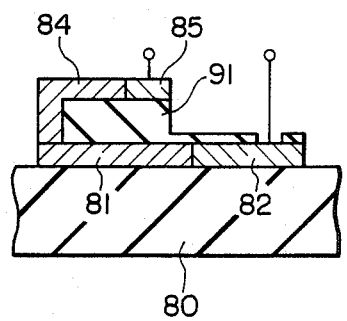
Figure 27A:
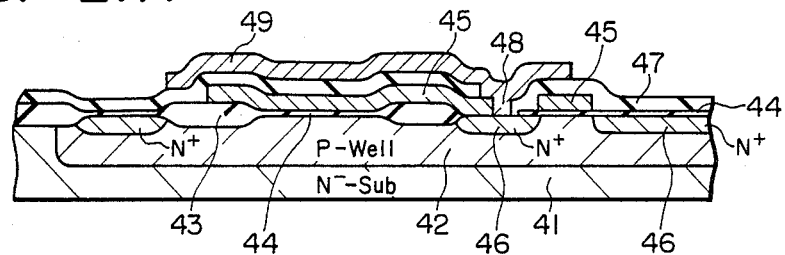
Figure 27B:
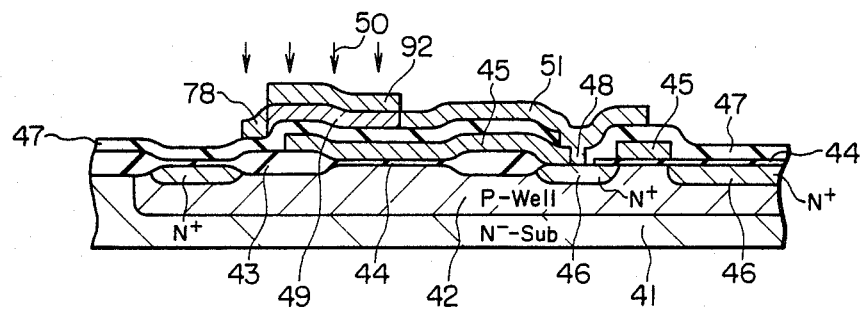
Figure 27C:
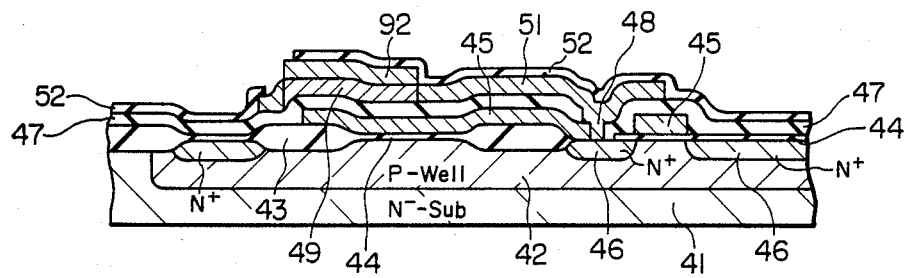
Figure 27D:
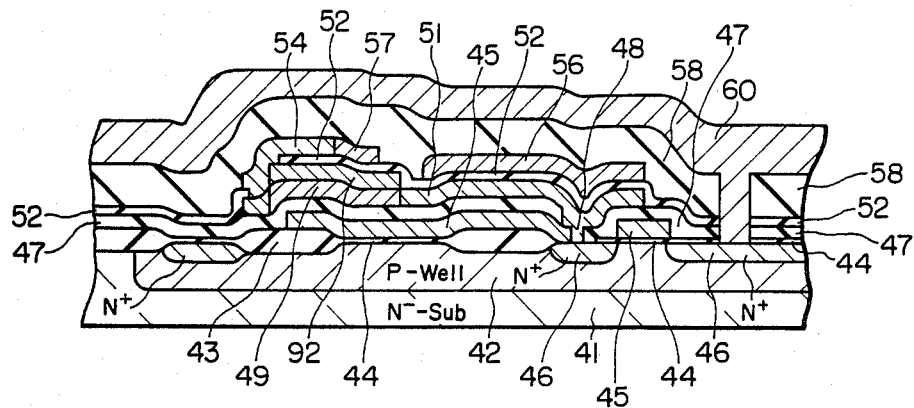

In the structure of FIG. 26, an SiO$_2$ layer 91 having an increased thickness is interposed between the first high resistivity polycrystalline silicon layer 81 and the second high resistivity polycrystalline silicon layer 84, to decrease the electric field effect. FIGS. 27A to 27D illustrate a fabrication process of the embodiment of FIG. 26. The MOS transistor is formed, the SiO$_2$ layer 47 is deposited, the contact hole 48 is formed, and the first high resistivity polycrystalline silicon layer 49 is deposited (FIG. 27A) in the same manner as in the steps of FIGS. 10A to 10C. In this embodiment, an SiO$_2$ film having a thickness of 50 to 1000 nm is formed on a region where a high resistivity area is to be formed in the first high resistivity polycrystalline silicon layer 49 prior to forming a low resistivity area in the first high resistivity polycrystalline silicon layer 49. With the SiO$_2$ film 92 as a mask, impurities 50 such as phosphorus ions or arsenic ions are implanted to form low resistivity areas 51 and 78 in a self-aligned manner (FIG. 27B). The subsequent steps (FIGS. 27C, 27D) are the same as those of FIGS. 10E to 10H.

According to the seventh embodiment of the present invention, the electric field effect produced by the high resistivity polycrystalline silicon layer and by the inter-connection for supplying the power supply voltage Vcc, is suppressed, and the resistance of the high resistivity load is stabilized. Moreover, a region that forms a high resistivity area in the first polycrystalline silicon layer can be formed in a self-aligned manner. Therefore, there is no need of giving attention to the margin for aligning the mask, and a process can be provided that is suited for highly densely intergrating the memory cells.

Embodiment 8

This embodiment is to prevent the decrease of effective capacity of the capacitor caused by the misalignment between the first polycrystalline silicon layer and the second polycrystalline silicon layer. In this embodiment, the upper electrode of the capacitor is impressed with the ground level Vss or a voltage one-half the power supply voltage.

Figure 28A:
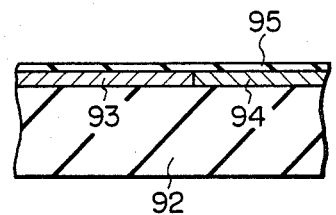
FIGS. 28A to 30 are diagrams illustrating an eighth embodiment of the present invention.
Figure 28B:
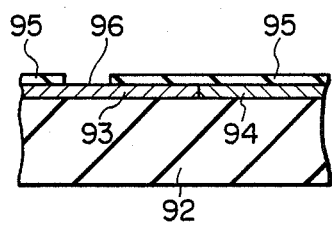
Figure 28C:
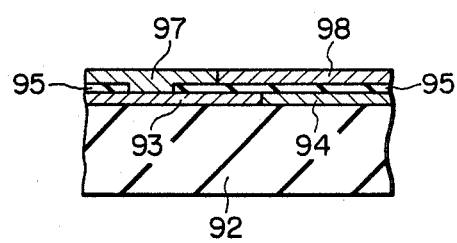
Figure 28D:
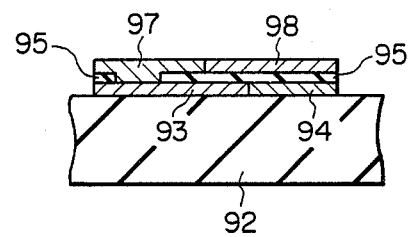
Figure 28E:
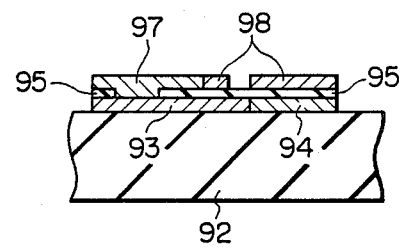

According to this embodiment as shown in FIGS. 28A to 28E, the first polycrystalline silicon layer and the second polycrystalline silicon layer are etched simultaneously to prevent the misalignment from occurring. FIGS. 28A to 28E illustrate a process for forming the high resistivity load and the capacitor according to this embodiment. A first high resistivity polycrystalline silicon layer 93 is deposited and is doped with impurities thereby to form a low resistivity area 94. The surface of the first polycrystalline silicon film 94 is thermally oxidized, and a silicon nitride film 95 is deposited thereon (FIG. 28A). Then, a contact hole 96 is formed (FIG. 28B), a second high resistivity polycrystalline silicon layer 97 is deposited and is doped with impurities thereby to form a low resistivity area 98 (FIG. 28C). Then, the first and second polycrystalline silicon layers are simultaneously patterned by dry etching (FIG. 28D). The low resistivity area 98 of the second polycrystalline silicon film is divided by etching to form a plate of the capacitor and a portion for supplying the power supply voltage Vcc to the high resistivity load (FIG. 28E).

Figure 29:
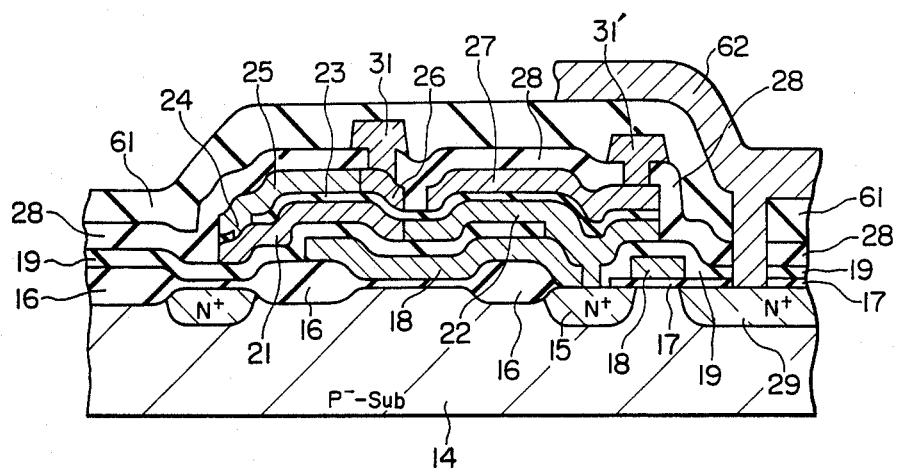
Figure 30:
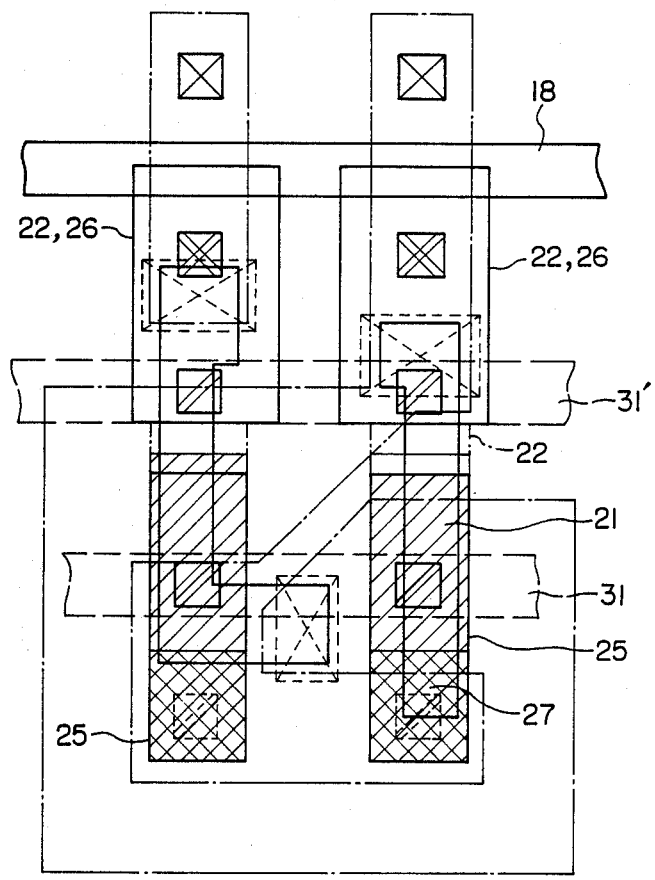
Figure 31A:
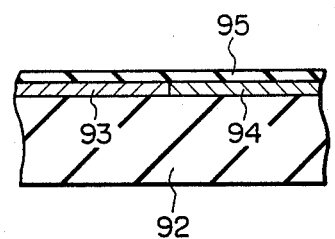
FIGS. 31A to 33 are diagrams illustrating a ninth embodiment of the present invention.
Figure 31C:
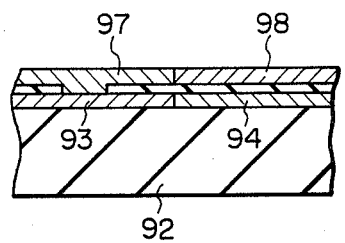
Figure 31B:
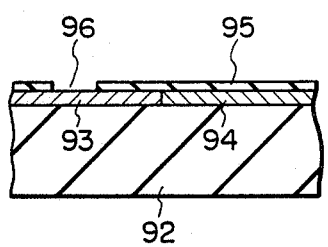
Figure 31D:
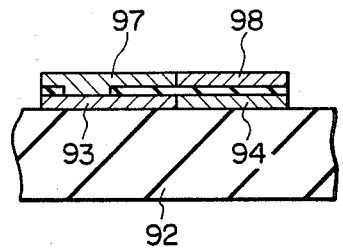

FIG. 29 is a section view showing the structure of the static memory cell according to this embodiment, wherein the first aluminum inter-connection layer 31 is connected to the second low resistivity polycrystalline silicon layers 26 and 27. The data line is formed by the second aluminum inter-connection layer 62. FIG. 30 is a plan view showing the layout of the static memory cell according to this embodiment, wherein the data line is not described to assist the comprehension of the drawing. Contours of the first polycrystalline silicon layers 22, 21 and of the second polycrystalline silicon layers 25, 26, 27 are overlapped, lending the static memory cell well for being highly densely integrated.

According to the eighth embodiment of the present invention, the first polycrystalline silicon film is patterned in a self-aligned manner with the second polycrystalline silicon film as a mask for dry etching. Therefore, the capacity is not decreased by the misalignment between the first polycrystalline silicon film and the second polycrystalline silicon film.

Embodiment 9

According to this embodiment, the power supply voltage is applied to the upper electrode of the capacitor in the static memory cell of the embodiment 8.

Figure 32:
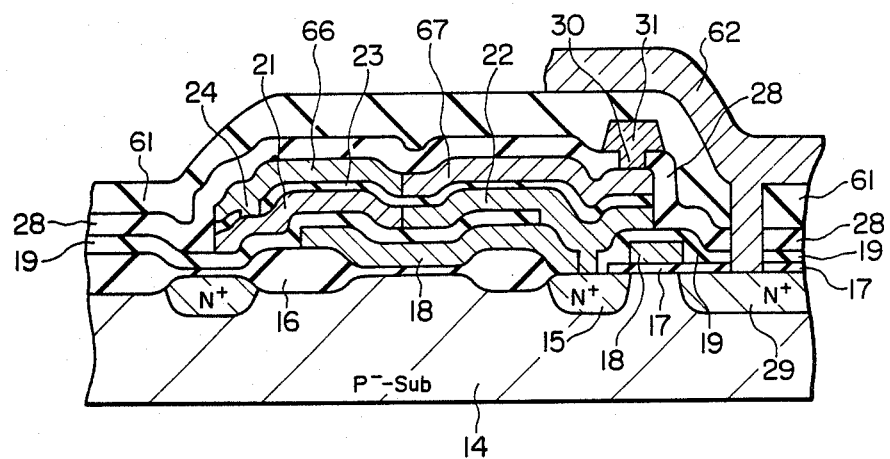
Figure 33:
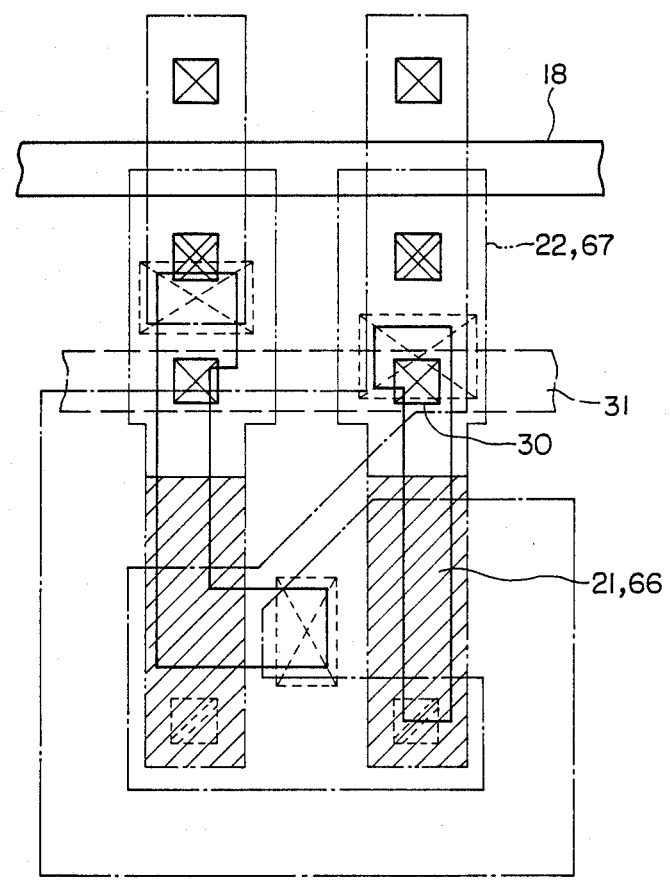

FIGS. 31A to 31D illustrate a process for forming the high resistivity load and the capacitor in the static memory according to this embodiment. The fabrication process according to this embodiment will now be described. A first high resistivity polycrystalline silicon layer 93 is deposited, second polycrystalline silicon layers 97, 98 are formed and are simultaneously subjected to the dry etching quite in the same manner as the steps of FIGS. 28A to 28D. In this embodiment the same mask pattern may be used to dope the impurities to form low resistivity areas 94, 98 in the first and second polycrystalline silicon layers. Further, the low resistivity area 98 of the second polycrystalline silicon film needs not be divided by etching unlike that of the embodiment 7. FIG. 32 is a section view showing the structure of the static memory cell according to this embodiment, wherein a metal electrode 31 such as of aluminum is connected via contact hole 30 to the low resistivity area 67 of the second polycrystalline silicon layer to apply the power supply voltage Vcc thereto. FIG. 33 is a plan view showing the layout of the static memory cell according to this embodiment, wherein the high resistivity area 21 and the low resistivity area 22 of the first polycrystalline silicon layer, and the high resistivity area 66 and the low resistivity area 67 of the second polycrystalline silicon layer, are completely overlapped upon one another. The electric power is supplied by the aluminum electrode 31 to the low resistivity area 22 of the second polycrystalline silicon layer via contact hole 30.

According to this embodiment as described above, the first polycrystalline silicon layer and the second polycrystalline silicon layer are completely overlapped, and no layout tolerance is required for aligning the mask. Therefore, the static memory cells can be integrated highly densely.

According to the ninth embodiment of the present invention, the power supply voltage Vcc is applied to the plate of the capacitor of the embodiment 8. Therefore, the effect of the embodiment 4 is obtained in addition to the effect of the embodiment 8.

Embodiment 10

This embodiment is concerned with a method of connecting the first high resistivity polycrystalline silicon layer to the second high resistivity polycrystalline silicon layer. This connection method is effective to reducing the area of the memory cell.

Figure 34A:
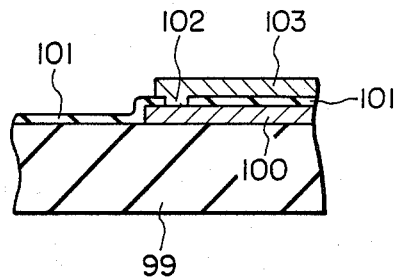
FIGS. 34A to 38 are diagrams illustrating a tenth embodiment of the present invention.
Figure 34B:
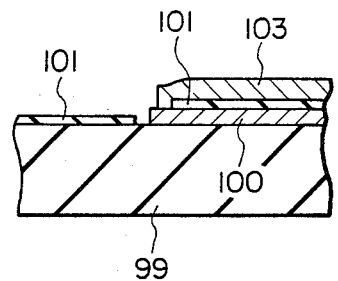

The method shown in FIGS. 34A and 34B is the same as the methods of the embodiments described thus far. Namely, a contact hole 102 is formed in an insulating film 101 on a first high resistivity polycrystalline silicon layer 100, so that the first high resistivity polycrystalline silicon layer 100 is connected to a second high resistivity polycrystalline silicon layer 103 (FIG. 34A). Here, the contact hole 102 may not be formed on the first high resistivity polycrystalline silicon layer 100, but may be formed to include the end of the first high resistivity polycrystalline silicon layer 100 as shown in FIG. 34B to reduce the area of the memory cell.

Figure 35:
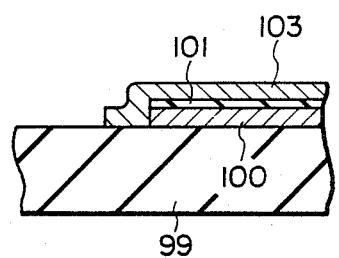

According to this embodiment as shown in FIG. 35, the first high resistivity polycrystalline silicon layer 100 is patterned, the insulator 101 is deposited, and the first high resistivity polycrystalline silicon layer 100 and the insulator 101 are etched again simultaneously. Therefore, the side wall of the first high resistivity polycrystalline silicon layer 100 is exposed, and the second high resistivity layer 103 is so formed as to cover the exposed side wall of the first high resistivity polycrystalline silicon layer 100. Thus, the first and second high resistivity polycrystalline silicon layers 100 and 103 are connected together.

Figure 36:
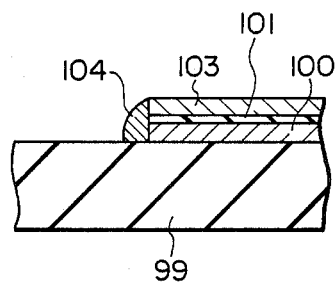

With reference to FIG. 36, edges of the first high resistivity polycrystalline silicon layer 100, the insulator 101, and the second high resistivity polycrystalline silicon layer 103 are etched again simultaneously. Side walls of the first and second high resistivity polycrystalline silicon layers 100, 103 are exposed, and a side spacer 104 composed of low resistivity polycrystalline silicon is formed on the side walls in a self-aligned manner. The first and second high resistivity polycrystalline silicon layers 100 and 103 are connected together via the side spacer 104.

Figure 37:
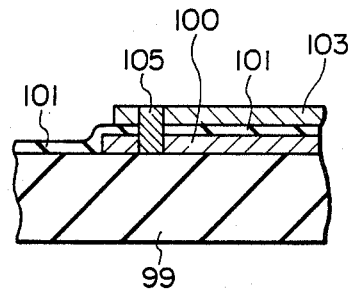

With reference to FIG. 37, the first polycrystalline silicon layer 100, the insulator 101 and the second polycrystalline silicon layer 103 are formed, and then a contact hole is formed so as to reach the first polycrystalline silicon layer 100. Low resistivity polycrystalline silicon 105 is deposited in the contact hole in a self-alinged manner. The first and second high resistivity polycrystalline silicon layers 100, 103 are connected together via low resistivity polycrystalline silicon 105 that is deposited.

Figure 38:
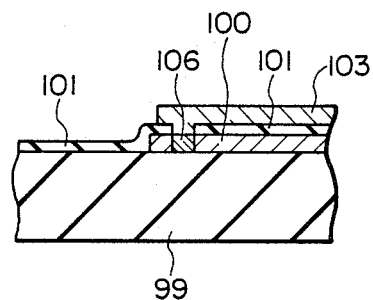

With reference to FIG. 38, a low resistivity area 106 is formed in the first high resistivity polycrystalline silicon layer 100 by implanting ions through a contact hole formed in the insulator 101, so that the first high resistivity polycrystalline silicon layer 100 is ohmic-connected to the second high resistance polycrystalline silicon layer 103. In order to ohmic-connect the first high resistivity polycrystalline silicon layer 100 to the second high resistivity polycrystalline silicon layer 103, furthermore, a low resistivity area may be formed in advance in a portion of the first polycrystalline silicon layer 100 that will be connected to the second high resistivity polycrystalline silicon layer 103.

According to the tenth embodiment of the present invention, no margin for aligning the mask is required to connect the first and second polycrystalline silicon layers together. Namely, there is provided a process which is suited for highly densely integrating the static memory cells.

Embodiment 11

This embodiment relates to a static memory cell of the type in which the electric power is supplied to the first high resistivity polycrystalline silicon layer by using the same layer as the second low resistivity polycrystalline silicon layer that forms an opposed electrode of the capacitor.

Figure 39:
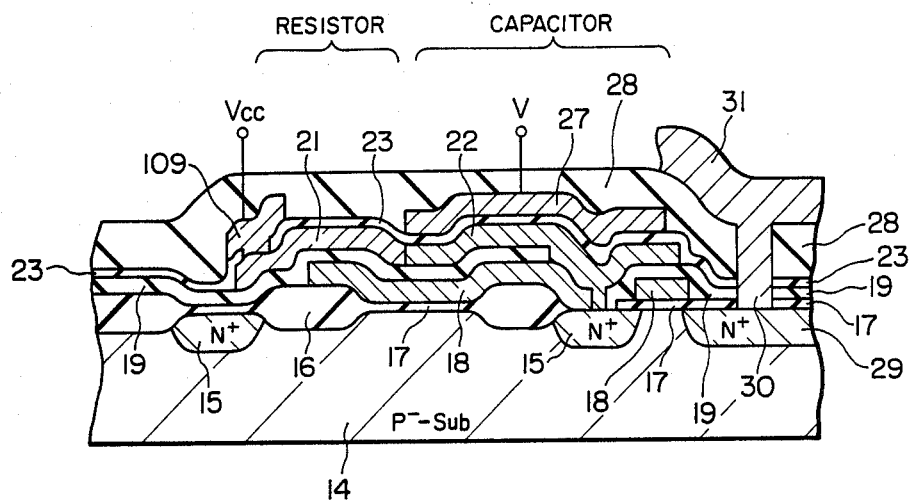
FIGS. 39 to 40 are diagrams illustrating an eleventh embodiment of the present invention.

FIG. 39 is a section view showing the structure of the static memory cell according to this embodiment. In this embodiment, the high resistivity load is constituted by the first high resistivity polycrystalline silicon layer 21 alone, and a low resistivity area 22 is formed at an end of the first high resistivity polycrystalline silicon layer 21 to constitute a lower electrode of the capacitor. The second low resistivity polycrystalline silicon layer constitutes an upper electrode 27 of the capacitor, and further works as an electrode 109 to supply the electric power to the first high resistivity polycrystalline silicon layer 21. The low resistivity area 27 of the second low resistivity polycrystalline silicon layer is impressed with the power supply voltage Vcc, the ground level Vss, or nay voltage V having a value therebetween, and the low resistivity area 109 is impressed with the power supply voltage Vcc. Here, the impurity region may be restricted by photolithography to form the low resistivity area 22 of the first polycrystalline silicon layer. Or, the low resistivity area 22 may be formed by utilizing the redistribution of impurities from the source or drain diffusion layer 15 of MOS transistor caused by annealing. In this case, no step is required for forming the high resistivity area 21 and the low resistivity area 22 in the first polycrystalline silicon layer, and no photomask is required, either, enabling the fabrication process to be further simplified. Here, the second low resistivity polycrystalline silicon layers 27, 109 may not be composed of polycrystalline silicon layers but may be metal electrodes such as of aluminum.

Figure 40:
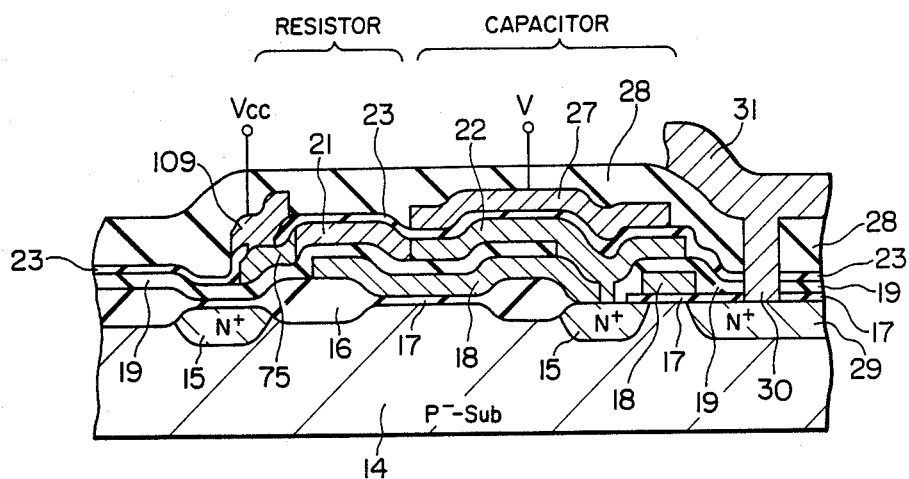

With reference to FIG. 40, the low resistivity area 75 is formed in the first high resistivity polycrystalline silicon layer 21 under the low resistivity area 109 of the second polycrystalline silicon layer. In this case, also, the impurity region may be restricted by photolithography in the same manner as the above-mentioned case. Here, however, the low resistivity area 75 can also be formed by utilizing the redistribution of impurities from the low resistivity area 109 of the second polycrystalline silicon layer caused by annealing.

According to the eleventh embodiment of the present invention, the impurity-diffused interconnection layer for applying the power supply voltage has a decreased distance relative to the high resistivity area. Therefore, the high resistivity area has a substantially increased length, and the high resistivity load exhibits a stable resistance.

Embodiment 12

This embodiment is concerned with a static MOS memory cell having a high resistivity load formed in the first polycrystalline silicon layer only that was described in the embodiments 6 and 11, the high resistivity load exhibiting electrically stable property.

Figure 41:
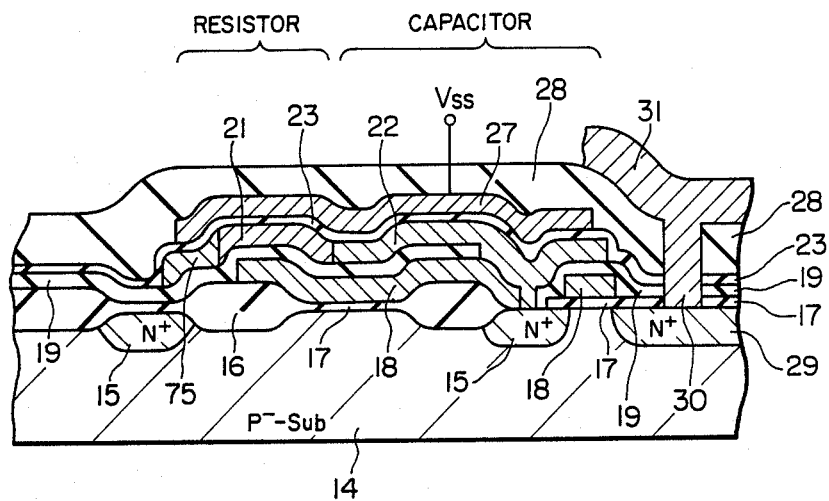
FIGS. 41 to 42 are diagrams illustrating a twelfth embodiment of the present invention.

FIG. 41 is a section view showing the structure of the static MOS memory according to this embodiment, wherein the high resistivity load is constituted by the first high resistivity polycrystalline silicon layer 21 alone in the same manner as the embodiment 6. However, of the low resistivity polycrystalline silicon layers 22 and 75 formed at both ends of the first high resistivity polycrystalline silicon layer 21, the low resistivity polycrystalline silicon layer 75 also works as an inter-connection for supplying the power supply voltage Vcc, making a difference from the embodiment 6. The capacitor is formed by the second low resistivity polycrystalline silicon layer 27 and the first low resistivity polycrystalline silicon 22 with the insulator 23 being interposed therebetween. The second low resistivity polycrystalline silicon layer 27 which assumes the ground level Vss, is so formed as to be overlapped on the first high resistivity polycrystalline silicon layer 21, so that the high resistivity load constituted by the first high resistivity polycrystalline silicon 21 is electrically shielded. Therefore, the high resistivity load constituted by the first high resistivity polycrystalline silicon layer 21 exhibits electrically stable resistance without affected by noise or electric field established by the upper layer.

In the above embodiment, the first and second polycrystalline silicon layers are processed independently of each other. However, the first and second polycrystalline silicon layers may be processed to possess the same pattern. In this case, the first polycrystalline silicon layers 21, 22, 75, the insulator 23, and the second polycrystalline silicon layer 27 may be dry-etched simultaneously to simplify the fabrication process. It is further possible to prevent the electrostatic capacity from decreasing, that is caused by the misalignment between the first low resistivity polycrystalline silicon layer 22 and the second low resistivity polycrystalline silicon layer 27.

Figure 42:
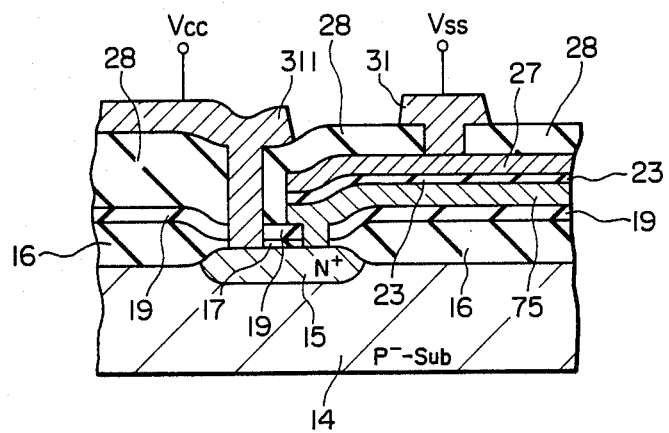

Described below is a method of supplying electric power to the first low resistivity polycrystalline silicon layer 75 and to the second low resistivity polycrystalline silicon layer 27 in conjunction with FIG. 42 which is a section view showing the structure of a connection portion that connects to a metal electrode such as aluminum electrode and that is formed near the memory to supply the electric power to the memory. In FIG. 42, the first low resistivity polycrystalline silicon layer 23 is connected to an $n^+$-type diffusion layer 15 having a high impurity concentration formed in the silicon substrate 14. Metal electrodes 31, 311 such as of aluminum for supplying electric power are connected to the second low resistivity polycrystalline silicon layer 27 and to the diffusion layer 15 having a high impurity concentration formed in the silicon substrate 14 via contact holes formed in the insulators 28, 19, 17. The metal electrode 31 is impressed with the ground level Vss, and the metal electrode 311 is impressed with the power supply voltage Vcc through the diffusion layer 15 having a high impurity concentration.

According to the twelfth embodiment of the present invention, the shielded electrode on the high resistivity load of the first layer and the upper electrode (Vss plate) of the capacitor, are formed by the same layer, contributing to simplifying the manufacturing process. Moreover, since the high resistivity is shielded, the electric field effect from the electrode of the upper layer can be shielded and the resistance can be stabilized electrically.

Embodiment 13

This embodiment is related to a dynamic memory cell which consists of four MOS transistors and two capacitors, without having high resistivity load. According to this embodiment, the memory cell is dynamically operated, a control circuit is provided in the periphery to automatically refresh the memory cell, and the memory cell is statically operated from the external side.

Figure 43:
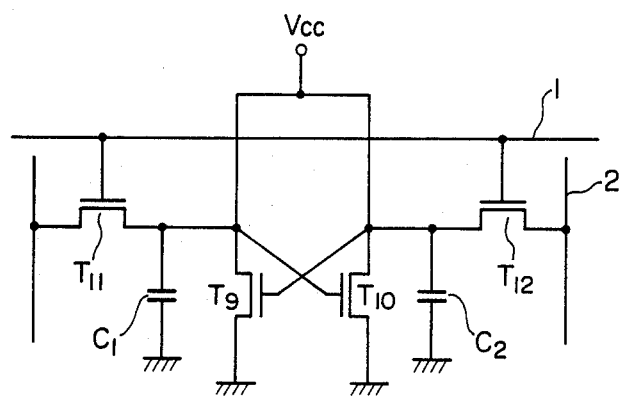
FIGS. 43 to 45 are diagrams illustrating a thirteenth embodiment of the present invention.

FIG. 43 is a diagram of an equivalent circuit of the dynamic memory cell which consists of four MOS transistors $T_9$, $T_{10}$, $T_{11}$, $T_{12}$ and two capacitors $C_1$, $C_2$. The power supply voltage Vcc is applied to the drains of two MOS transistors $T_9$, $T_{10}$ that constitute a flip-flop, and the dynamic operation is performed by the charge and discharge of the capacitors $C_1$, $C_2$.

Figure 44:
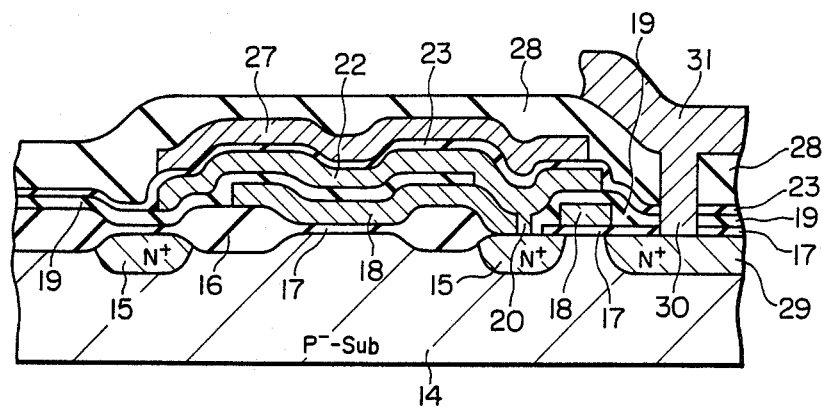

FIG. 44 is a section view illustrating the structure of the dynamic MOS memory cell according to this embodiment, wherein the first polycrystalline silicon layer 22 and the second polycrystalline silicon layer 27 are highly doped with impurities so that their resistance decreases, and constitute a lower electrode and an upper electrode of the capacitor. The capacitor is connected to the source or drain region 15 of the MOS transistor, and stores the data as it is electrically charged or discharged.

Figure 45:
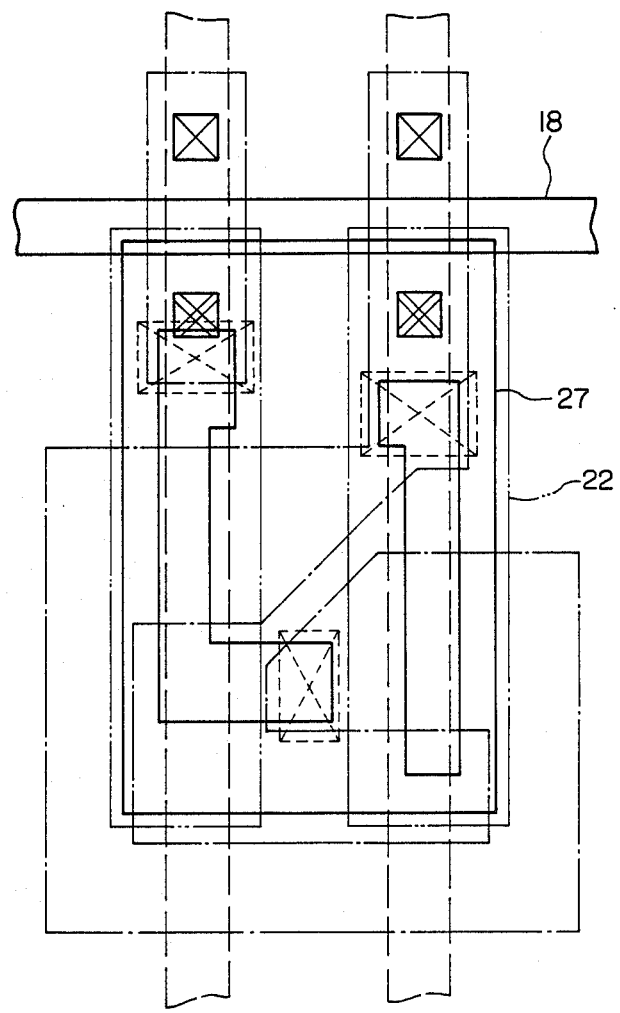

FIG. 45 is a plan view showing the layout of the dynamic MOS memory cell according to this embodiment, wherein the first low resistivity polycrystalline silicon layer 22 and the second low resistivity polycrystalline silicon layer 27 constitute the lower electrode and the upper electrode of the capacitor. The second low resistivity polycrystalline silicon layer 27 is impressed with the ground level Vss and, hence, also works as a grounded line.

The dynamic memory cell of the 4-MOS type to which the capacitor is added, exhibits a decreased soft error rate that is caused by the alpha particles. Furthermore, the dynamic memory cell of this type which forms the flip-flop circuit holds the data more stably than the dynamic memory cell of the 1-MOS type. According to this embodiment which does not have high resistivity load, the capacitor on the memory cell is allowed to have an increased area. Therefore, there is provided a dynamic memory cell which exhibits a decreased soft error rate.

According to all of the embodiments of the present invention as described above, there is provided a static memory cell that can be highly densely integrated and tat has an increased immunity against the alpha particles that cause soft error to develop.

Merits:

(1) Since high resistance is not required, the fabrication process can be simplified.

(2) The potential amplitude of the bit line (data line) is about one-tenth that of the DRAM and, hence, the consumption of electric power decreases.

Demerit:

(1) The automatic refreshing must be effected maintaining a timing and, hence, the cycle time becomes longer than the access time, causing the circuit operation to become slow.

It is further understood by those skilled in the art that the foregoing description has dealt with preferred embodiments of the disclosed device and that various changes and modifications may be made in the invention without departing from the spirit and scope thereof.

What is claimed is:

1. A memory device comprising:
a semiconductor substrate, first and second field-effect transistors formed on said substrate, and first and second capacitors and first and second resistors formed on said field-effect transistors, wherein:
a source (drain) electrode of said first field-effect transistor is electrically connected to a gate electrode of said second field-effect transistor;
a source (drain) electrode of said second field-effect transistor is electrically connected to a gate electrode of said first field-effect transistor;
an electrode of said first resistor is electrically connected to the source (drain) electrode of said first field-effect transistor, and another electrode of said first resistor is connected to a power supply voltage;
an electrode of said second resistor is electrically connected to the source (drain) electrode of said second field-effect transistor, and another electrode of said second resistor is connected to the power supply voltage;
a first electrode of said first capacitor is connected to the source (drain) electrode of said first field-effect transistor, and a second electrode of said first capacitor is connected to a constant potential;
a first electrode of said second capacitor is connected to the source (drain) electrode of said second field-effect transistor, and a second electrode of said second capacitor is connected to said constant potential;
said first electrode of said first capacitor is a first conductive layer which is different from a layer of the gate electrode of the first field-effect transistor, and said second electrode of said first capacitor is a second conductive layer which is different from a layer of the gate electrode of the first field-effect transistor;
said first electrode of said second capacitor is the first conductive layer which is different from the gate electrode of the second field-effect transistor; and
said second electrode of said second capacitor is the second conductive layer which is different from the gate electrode of the second field-effect transistor,
wherein said first and second capacitors as well as said first and second resistors are formed by being stacked on said first and second field-effect transistors, wherein each of said first and second capacitors has two polycrystalline silicon layers, and wherein the source and/or drain regions of said first and second field-effect transistors comprise impurity regions formed in said semiconductor substrate, and a silicide layer of a refractory metal is formed on the surfaces of said impurity regions.

2. A memory device comprising:

a semiconductor substrate, first and second field-effect transistors formed on said substrate, and first and second capacitors and first and second resistors formed on said field-effect transistors, wherein:

a source (drain) electrode of said first field-effect transistor is electrically connected to a gate electrode of said second field-effect transistor;

a source (drain) electrode of said second field-effect transistor is electrically connected to a gate electrode of said first field-effect transistor;

an electrode of said first resistor is electrically connected to the source (drain) electrode of said first field-effect transistor, and another electrode of said first resistor is connected to a power supply voltage;

an electrode of said second resistor is electrically connected to the source (drain) electrode of said second field-effect transistor, and another electrode of said second resistor is connected to the power supply voltage;

a first electrode of said first capacitor is connected to the source (drain) electrode of said first field-effect transistor, and a second electrode of said first capacitor is connected to a constant potential;

a first electrode of said second capacitor is connected to the source (drain) electrode of said second field-effect transistor, and a second electrode of said second capacitor is connected to said constant potential;

said first electrode of said first capacitor is a first conductive layer which is different from a layer of the gate electrode of the first field-effect transistor, and said second electrode of said first capacitor is a second conductive layer which is different from a layer of the gate electrode of the first field-effect transistor;

said first electrode of said second capacitor is the first conductive layer which is different from the gate electrode of the second field-effect transistor; and said second electrode of said second capacitor is the second conductive layer which is different from the gate electrode of the second field-effect transistor, wherein said first and second capacitors as well as said first and second resistors are formed by being stacked on said first and second field-effect transistors, wherein each of said first and second capacitors has two polycrystalline silicon layers, and wherein a silicide layer of a refractory metal is formed on at least portions of the gate electrodes of said first and second field-effect transistors.

3. A memory device comprising:

a semiconductor substrate, first and second field-effect transistors formed on said substrate, and first and second capacitors and first and second resistors formed on said field-effect transistors, wherein:

a source (drain) electrode of said first field-effect transistor is electrically connected to a gate electrode of said second field-effect transistor;

a source (drain) electrode of said second field-effect transistor is electrically connected to a gate electrode of said first field-effect transistor;

an electrode of said first resistor is electrically connected to the source (drain) electrode of said first field-effect transistor, and another electrode of said first resistor is connected to a power supply voltage;

an electrode of said second resistor is electrically connected to the source (drain) electrode of said second field-effect transistor, and another electrode of said second resistor is connected to the power supply voltage;

a first electrode of said first capacitor is connected to the source (drain) electrode of said first field-effect transistor, and a second electrode of said first capacitor is connected to a constant potential;

a first electrode of said second capacitor is connected to the source (drain) electrode of said second field-effect transistor, and a second electrode of said second capacitor is connected to said constant potential;

said first electrode of said first capacitor is a first conductive layer which is different from a layer of the gate electrode of the first field-effect transistor, and said second electrode of said first capacitor is a second conductive layer which is different from a layer of the gate electrode of the first field-effect transistor;

said first electrode of said second capacitor is the first conductive layer which is different from the gate electrode of the second field-effect transistor; and said second electrode of said second capacitor is the second conductive layer which is different from the gate electrode of the second field-effect transistor, wherein said first and second capacitors as well as said first and second resistors are formed by being stacked on said first and second field-effect transistors, wherein each of said first and second capacitors has two polycrystalline silicon layers, and wherein said first and second resistors include first and second polycrystalline silicon layers connected in series, and means for suppressing field effect is provided between said first and second polycrystalline silicon layers.

4. A memory device according to claim 1, 2 or 3, wherein the constant potential connected to the second electrode of said first and second capacitors is the ground potential.

5. A memory device according to claim 1, 2 or 3, wherein the constant potential connected to the second electrode of said first and second capacitors is a potential which is equal to one-half the power supply voltage.

6. A memory device according to claim 1, 2 or 3, wherein the power supply voltage is connected to said another electrodes of said first and second resistors via an inter-connection composed of aluminum.

7. A memory device according to claim 1, 2 or 3, further comprising:

a third field-effect transistor of which the drain (source) is connected to a first bit line and of which the source (drain) is connected to a node where the source (drain) of said first field-effect transistor is connected to said first resistor; and a fourth field-effect transistor of which the drain (source) is connected to a second bit line and of which the source (drain) is connected to a node where the source (drain) of said second field-effect transistor is connected to said second resistor; and a word line is divided into at least two or more lines, said word line being connected to the gate electrodes of said third and fourth field-effect transistors.

8. A memory device according to claim 1, 2 or 3, wherein the constant potential connected to the second electrode of said first and second capacitors is the power supply voltage.

9. A memory device according to claim 1, 2 or 3 wherein the first electrodes of the first and second capacitors are larger than the gate electrodes of the first and second field-effect transistors.

10. A memory device according to claim 1, 2 or 3, wherein said first and second resistors include a first polycrystalline silicon layer.

11. A memory device comprising:
a semiconductor substrate, first and second field-effect transistors formed on said substrate, and first and second capacitors and first and second resistors formed on said field-effect transistors, wherein:

a source electrode of said first field-effect transistor is electrically connected to a gate electrode of said second field-effect transistor;

a source (drain) electrode of said second field-effect transistor is electrically connected to a gate electrode of said first field-effect transistor;

an electrode of said first resistor is electrically connected to the source (drain) electrode of said first field-effect transistor, and another electrode of said first resistor is connected to a power supply voltage;

an electrode of said second resistor is electrically connected to the source (drain) electrode of said second field-effect transistor, and another electrode of said second resistor is connected to the power supply voltage;

a first electrode of said first capacitor is connected to the source (drain) electrode of said first field-effect transistor, and a second electrode of said first capacitor is connected to a constant potential;

a first electrode of said second capacitor is connected to the source (drain) electrode of said second field-effect transistor, and a second electrode of said second capacitor is connected to the constant potential;

said first electrode of said first capacitor is a first conductive layer which is different from a layer of the gate electrode of the first field-effect transistor, said second electrode of said first capacitor is a second conductive layer which is different from a layer of the gate electrode of the first field-effect transistor;

said first electrode of said second capacitor is a first conductive layer which is different from the gate electrode of the second field-effect transistor;

said second electrode of said second capacitor is a second conductive layer which is different from the gate electrode of the second field-effect transistor;

the gate electrodes of said first and second field-effect transistors include at least a portion of a silicide layer of a refractory metal; and the source and drain regions of said first and second field-effect transistors include at least a portion of a silicide layer of a refractory metal;

said memory device further comprising:
a third field-effect transistor having a drain (source) connected to a first bit line and a source (drain) connected to a node where the source (drain) of said first field-effect transistor is connected to said first resistor; and a fourth field-effect transistor having a drain (source) connected to a second bit line and a source (drain) connected to a node where the source (drain) of said second field-effect transistor is connected to said second resistor, wherein a word line is divided into at least two or more lines, said word line being connected to the gate electrodes of said third and fourth field-effect transistors;

wherein the gate electrodes of said third and fourth field-effect transistors include at least a portion of a silicide layer of a refractory metal; and wherein said first and second bit lines are composed of aluminum.

12. A memory device according to claim 11, wherein said first and second capacitors as well as said first and second resistors are formed by being stacked on said first and second field-effect transistors.

13. A memory device according to claim 12, wherein the first electrodes of the first and second capacitors are larger than the gate electrodes of the first and second field-effect transistors.

14. A memory device according to claim 11, wherein each of said first and second capacitors comprise two polycrystalline silicon layers.

15. A memory device comprising:
a semiconductor substrate, first and second field-effect transistors formed on said substrate, and first and second capacitors and first and second resistors formed on said field-effect transistors, wherein:

a source (drain) electrode of said first field-effect transistor is electrically connected to a gate electrode of said second field transistor;

a source (drain) electrode of said second field-effect transistor is electrically connected to a gate electrode of said first field-effect transistor;

an electrode of said first resistor is electrically connected to the source (drain) electrode of said first field-effect transistor, and another electrode of said first resistor is connected to a power supply voltage;

an electrode of said second resistor is electrically connected to the source (drain) electrode of said second field-effect transistor, and another electrode of said second resistor is connected to the power supply voltage;

a first electrode of said first capacitor is connected to the source (drain) electrode of said first field-effect transistor, and a second electrode of said first capacitor is connected to a constant potential;

a first electrode of said second capacitor is connected to the source (drain) electrode of said second field-effect transistor, and a second electrode of said second capacitor is connected to the constant potential;

said first electrode of said first capacitor is a first conductive layer which is different from a layer of the gate electrode of the first field-effect transistor;

said second electrode of said first capacitor is a second conductive layer which is different from a layer of the gate electrode of the first field-effect transistor;

a first electrode of said second capacitor is the first conductive layer which is different from the gate electrode of the second field-effect transistor;

said second electrode of said second capacitor is the second conductive layer which is different from the gate electrode of the second field-effect transistor;

the first electrode of the first and second capacitors are larger than the gate electrodes of the first and second field-effect transistors;

the second electrodes of the first and second capacitors are larger than the gate electrodes of the first and second field-effect transistors; and the first and second electrodes of the first and second capacitors substantially cover the gate electrodes of the first and second field effect transistors, respectively.

16. A memory device according to claim 15, wherein the constant potential connected to the second electrode of said first and second capacitors is the ground potential.

17. A memory device according to claim 15, wherein the constant potential connected to the second electrodes of said first and second capacitors is a potential which is equal to one-half the power supply voltage.

18. A memory device according to claim 15, wherein the power supply voltage is connected to the other electrodes of said first and second resistors via an interconnection composed of aluminum.

19. A memory device according to claim 15, further comprising:

a third field-effect transistor having a drain (source) connected to a first bit line and a source (drain) connected to a node where the source (drain) of said first field-effect transistor is connected to said first resistor;

a fourth field-effect transistor a drain (source) connected to a second bit line and a source (drain) connected to a node where the source (drain) of said second field-effect transistor is connected to said second resistor; and a word line divided into at least two or more lines, said word line being connected to the gate electrodes of said third and fourth field-effect transistors.

20. A memory device according to claim 15, wherein the constant potential connected to the second electrodes of said first and second capacitors is the power supply voltage.

* * * * *